(12) United States Patent
Shank et al.

(10) Patent No.: US 7,132,642 B2
(45) Date of Patent: *Nov. 7, 2006

(54) ANTI-ENTRAPMENT SYSTEMS FOR PREVENTING OBJECTS FROM BEING ENTRAPPED BY TRANSLATING DEVICES

(75) Inventors: David W. Shank, Hersey, MI (US); Randall L. Perrin, Cadillac, MI (US); John M. Washeleski, Cadillac, MI (US)

(73) Assignee: Nartron Corporation, Reed City, MI (US)

( * ) Notice: Subject to any disclaimer, the term of this patent is extended or adjusted under 35 U.S.C. 154(b) by 201 days.

This patent is subject to a terminal disclaimer.

(21) Appl. No.: 10/927,916

(22) Filed: Aug. 27, 2004

(65) Prior Publication Data

US 2005/0092097 A1    May 5, 2005

Related U.S. Application Data

(63) Continuation-in-part of application No. 10/262,446, filed on Sep. 30, 2002, now Pat. No. 6,782,759, which is a continuation-in-part of application No. 09/901,883, filed on Jul. 9, 2001, now Pat. No. 6,499,359.

(51) Int. Cl.
   *H01J 40/14* (2006.01)
(52) U.S. Cl. ..................... 250/221; 250/239
(58) Field of Classification Search ............. 250/221, 250/239
   See application file for complete search history.

(56) References Cited

U.S. PATENT DOCUMENTS

| 3,710,209 A | 1/1973 | Webb et al. |
| 3,875,481 A | 4/1975 | Miller et al. |
| 3,951,250 A | 4/1976 | Pointon et al. |
| 3,964,594 A | 6/1976 | Gabbrielli et al. |
| 3,965,399 A | 6/1976 | Walker, Jr. et al. |
| 4,132,487 A | 1/1979 | Fisher |
| 4,186,524 A | 2/1980 | Pelchat |
| 4,266,263 A | 5/1981 | Haberl et al. |
| 4,369,663 A | 1/1983 | Venturello et al. |
| 4,370,697 A | 1/1983 | Haberl et al. |
| 4,373,122 A | 2/1983 | Frame |
| 4,373,124 A | 2/1983 | Frame |
| 4,437,138 A | 3/1984 | Nicol |
| 4,521,685 A | 6/1985 | Rebman |
| 4,526,043 A | 7/1985 | Boie et al. |

(Continued)

FOREIGN PATENT DOCUMENTS

DE         37 34 023 A      4/1989

(Continued)

*Primary Examiner*—Que T. Le
(74) *Attorney, Agent, or Firm*—Brooks Kushman P.C.

(57) ABSTRACT

An anti-entrapment system for preventing an object from being entrapped by a translating device includes a capacitance sensor positioned adjacent to the translating device. The sensor has first and second conductors separated by a separation distance, a compressible dielectric element interposed between the conductors, and a non-conductive elastomer outer jacket encasing the conductors and the dielectric element. The sensor having a capacitance dependent upon the separation distance between the conductors. The capacitance changes in response to the separation distance changing as a result of the dielectric element compressing in response to a first object touching the outer jacket, and in response to a second conductive object coming into proximity with at least one of the conductors. A controller controls the translating device as a function of the capacitance in order to prevent the translating device from entrapping either object.

62 Claims, 17 Drawing Sheets

U.S. PATENT DOCUMENTS

| | | |
|---|---|---|
| 4,584,625 A | 4/1986 | Kellogg |
| 4,662,771 A | 5/1987 | Roe et al. |
| 4,731,548 A | 3/1988 | Ingraham |
| 4,758,735 A | 7/1988 | Ingraham |
| 4,831,279 A | 5/1989 | Ingraham |
| 4,839,512 A | 6/1989 | Speck |
| 4,843,891 A | 7/1989 | Brunner et al. |
| 4,976,337 A | 12/1990 | Trett |
| 4,983,896 A * | 1/1991 | Sugiyama et al. .......... 318/286 |
| 5,036,275 A | 7/1991 | Munch et al. |
| 5,087,825 A | 2/1992 | Ingraham |
| 5,131,401 A | 7/1992 | Westenskow et al. |
| 5,142,822 A | 9/1992 | Beckerman |
| 5,159,316 A | 10/1992 | Lazzara |
| 5,210,490 A | 5/1993 | Munch et al. |
| 5,216,364 A | 6/1993 | Ko et al. |
| 5,217,280 A | 6/1993 | Nykerk et al. |
| 5,334,876 A | 8/1994 | Washeleski et al. |
| 5,436,539 A | 7/1995 | Wrenbeck et al. |
| 5,447,076 A | 9/1995 | Ziegler |
| 5,459,962 A | 10/1995 | Bonne et al. |
| 5,621,290 A | 4/1997 | Heller et al. |
| 5,625,980 A | 5/1997 | Teich et al. |
| 5,642,043 A | 6/1997 | Ko et al. |
| 5,775,332 A | 7/1998 | Goldman |
| 5,789,915 A | 8/1998 | Ingraham |
| 5,796,183 A | 8/1998 | Hourmand |
| 5,851,026 A | 12/1998 | Schoos et al. |
| 5,880,421 A | 3/1999 | Tsuge et al. |
| 5,907,213 A | 5/1999 | Oshima et al. |
| 5,952,801 A | 9/1999 | Boisvert et al. |
| 6,006,386 A | 12/1999 | Mohaupt |
| 6,038,930 A | 3/2000 | Lehnen et al. |
| 6,064,165 A | 5/2000 | Boisvert et al. |
| 6,081,088 A | 6/2000 | Ishihara et al. |
| 6,142,513 A | 11/2000 | Schoos et al. |
| 6,233,872 B1 | 5/2001 | Glagow et al. |
| 6,288,464 B1 | 9/2001 | Torii et al. |
| 6,297,605 B1 | 10/2001 | Butler et al. |
| 6,320,335 B1 | 11/2001 | Saitou |
| 6,337,549 B1 | 1/2002 | Bledin |
| 6,377,009 B1 | 4/2002 | Philipp |
| 6,389,752 B1 | 5/2002 | Rosenau |
| 6,404,158 B1 | 6/2002 | Boisvert et al. |
| 6,483,054 B1 | 11/2002 | Suzuki et al. |
| 6,499,359 B1 | 12/2002 | Washeleski et al. |
| 6,515,399 B1 | 2/2003 | Lauf et al. |
| 6,661,642 B1 | 12/2003 | Allen et al. |
| 6,782,759 B1 | 8/2004 | Shank et al. |
| 6,842,148 B1 | 1/2005 | Hendler et al. |
| 6,946,853 B1 | 9/2005 | Gifford et al. |
| 6,968,746 B1 | 11/2005 | Shank et al. |
| 7,032,349 B1 | 4/2006 | Oberheide et al. |
| 7,038,414 B1 | 5/2006 | Daniels et al. |
| 2002/0043948 A1 | 4/2002 | Ogasawara |
| 2002/0078758 A1 | 6/2002 | Suzuki et al. |
| 2003/0056600 A1 | 3/2003 | Shank et al. |
| 2003/0089042 A1 | 5/2003 | Oberheide et al. |
| 2003/0151382 A1 | 8/2003 | Daniels et al. |
| 2004/0178924 A1 | 9/2004 | Gifford et al. |
| 2005/0012484 A1 | 1/2005 | Gifford et al. |
| 2005/0016290 A1 | 1/2005 | Shank et al. |

FOREIGN PATENT DOCUMENTS

| | | |
|---|---|---|
| DE | 40 04 353 A1 | 8/1991 |
| DE | 198 10 077 A1 | 9/1998 |
| DE | 197 32 027 A | 1/1999 |
| EP | 0 855 307 A2 | 7/1998 |
| EP | 1 154 110 A2 | 5/2001 |
| FR | 2 163 814 A | 7/1973 |
| JP | 8029271 | 2/1996 |
| WO | WO 2005/059285 | 6/2005 |

* cited by examiner

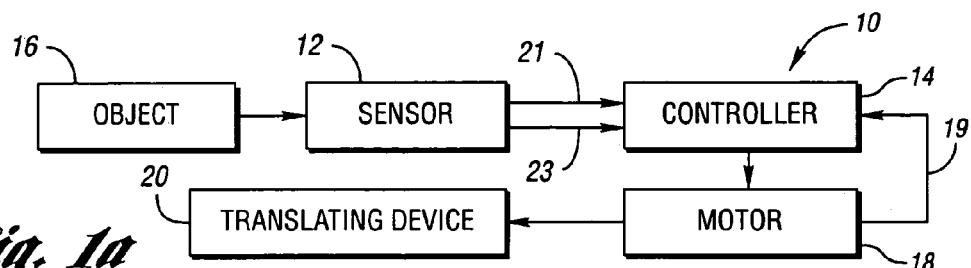
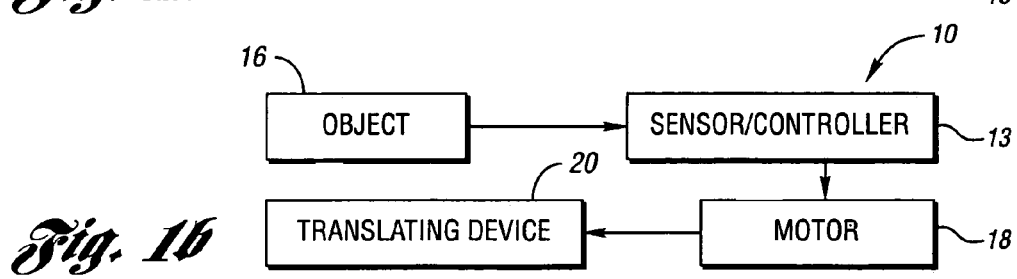
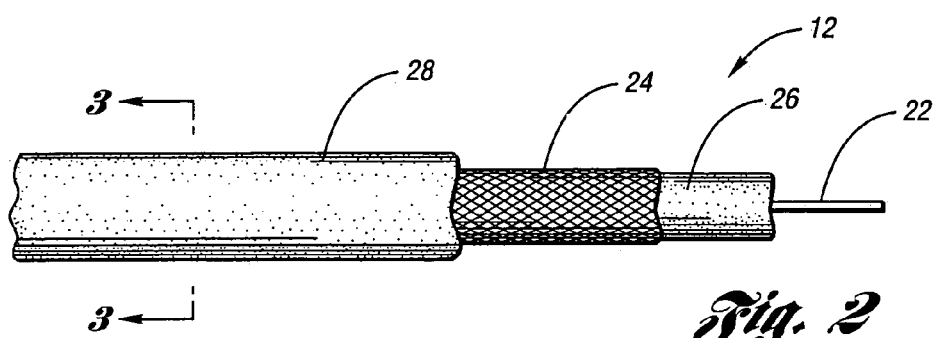
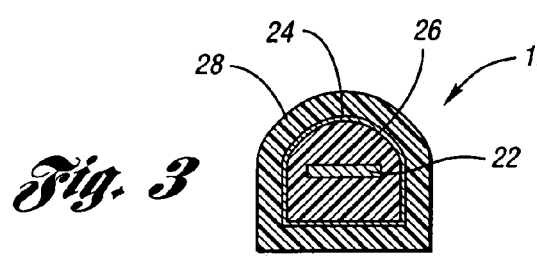
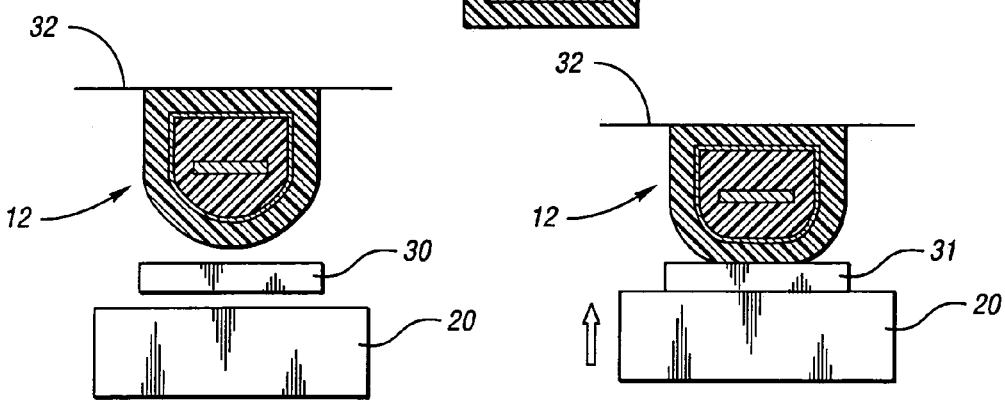

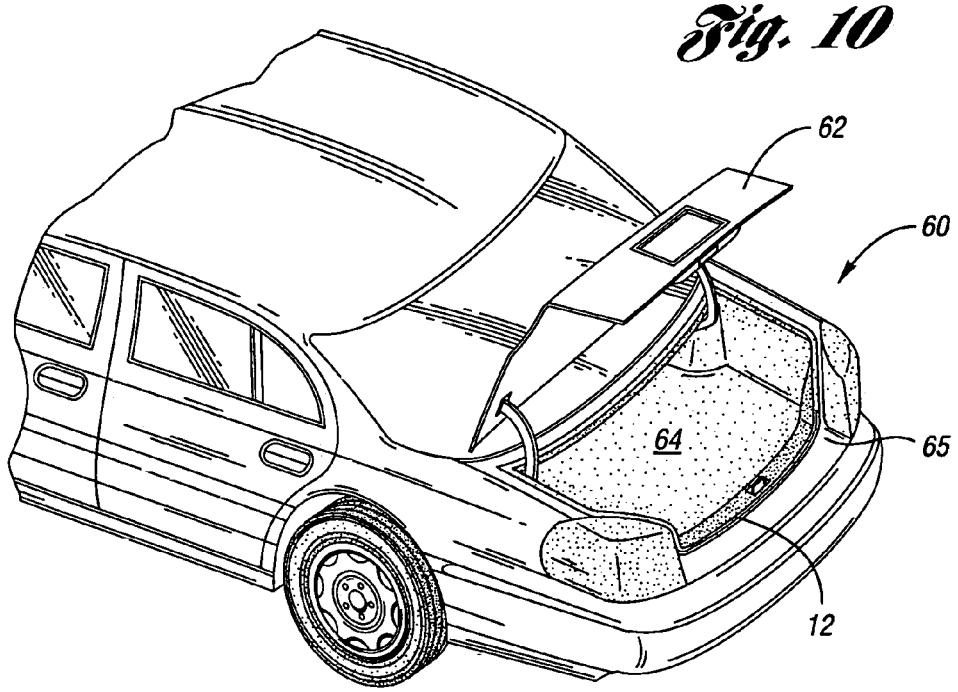
Fig. 10
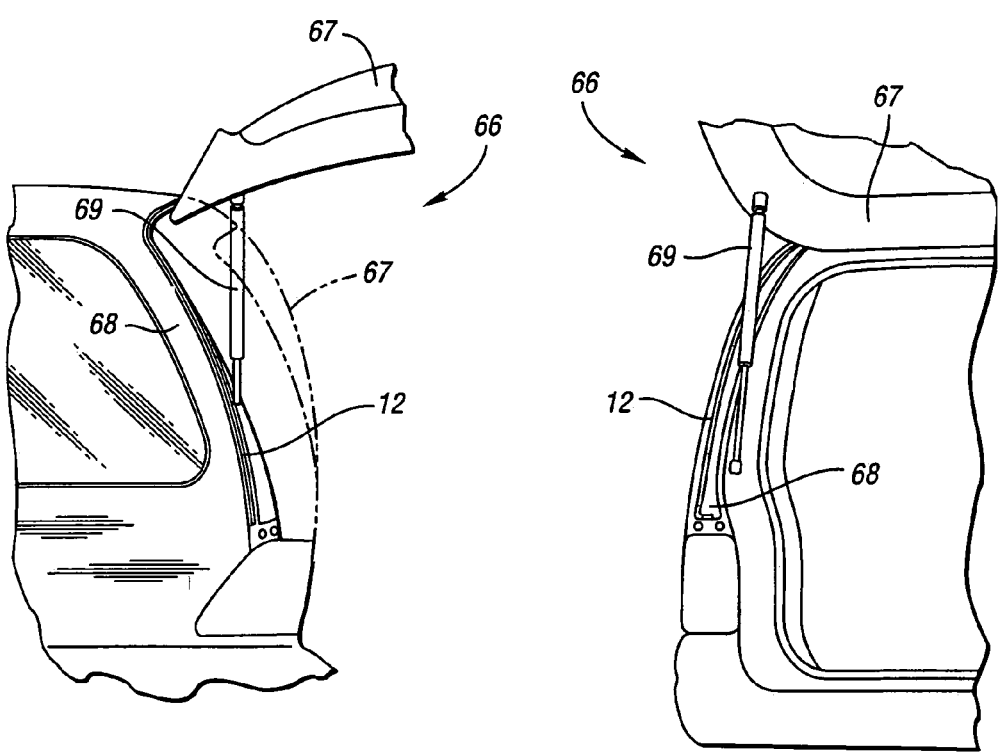
Fig. 11a
Fig. 11b

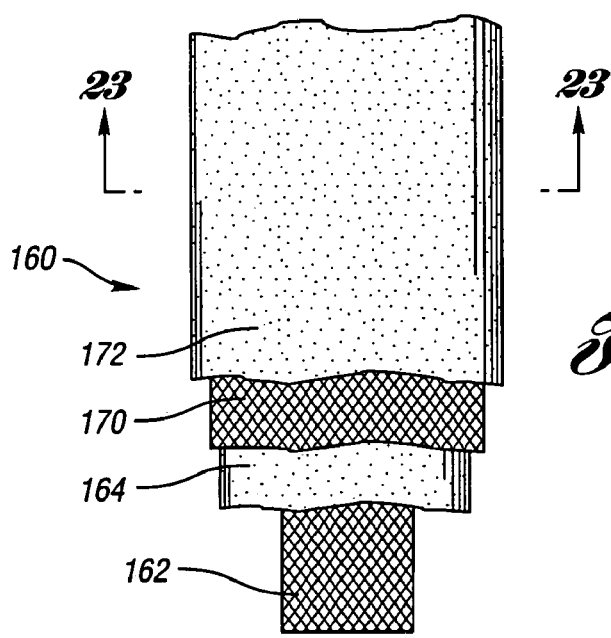
*Fig. 22*
*Fig. 23*
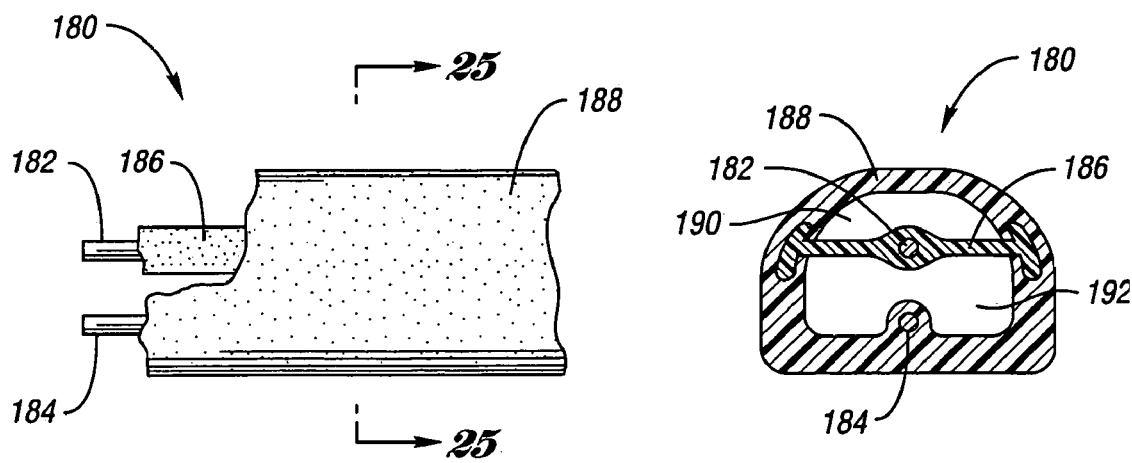
*Fig. 24*
*Fig. 25*

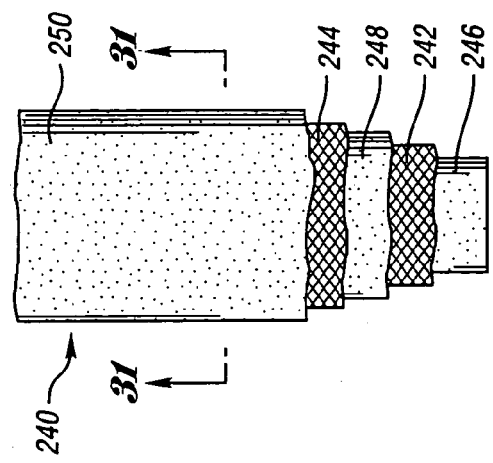
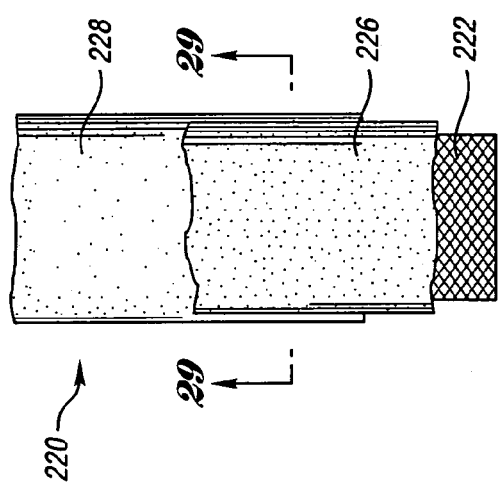
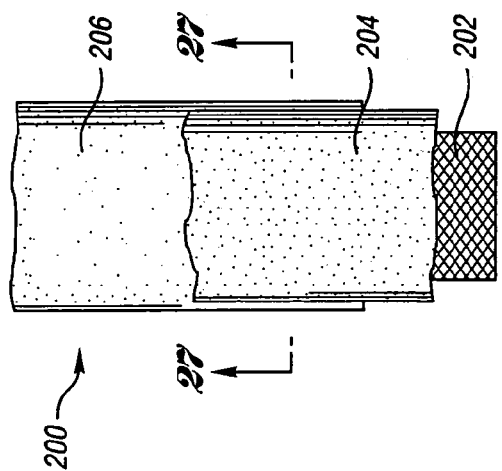
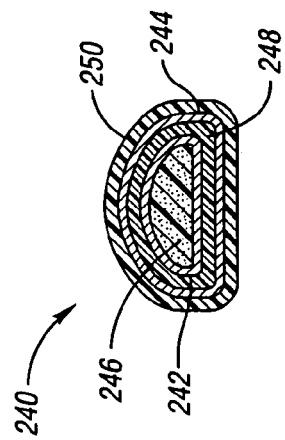
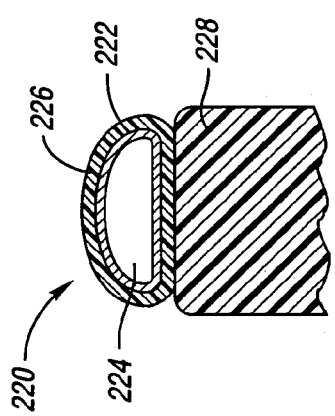
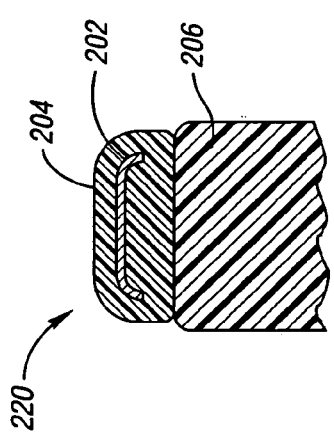

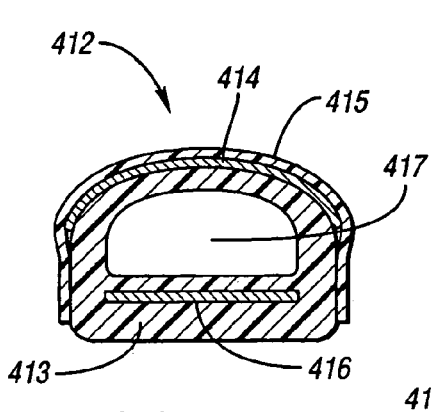
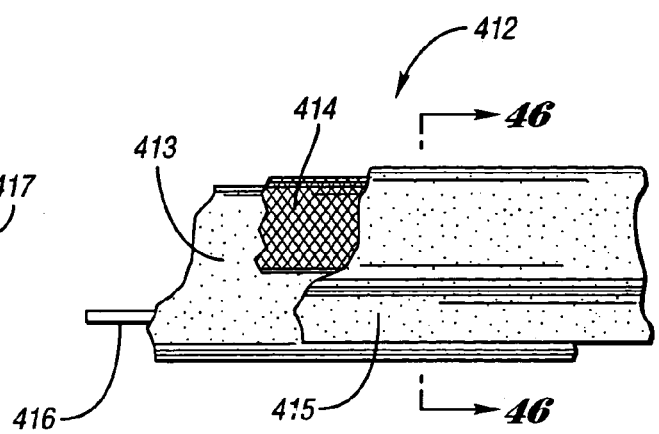
Fig. 46          Fig. 47
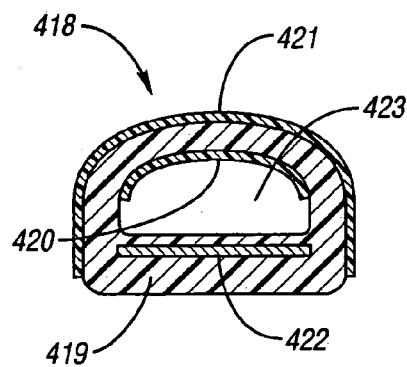
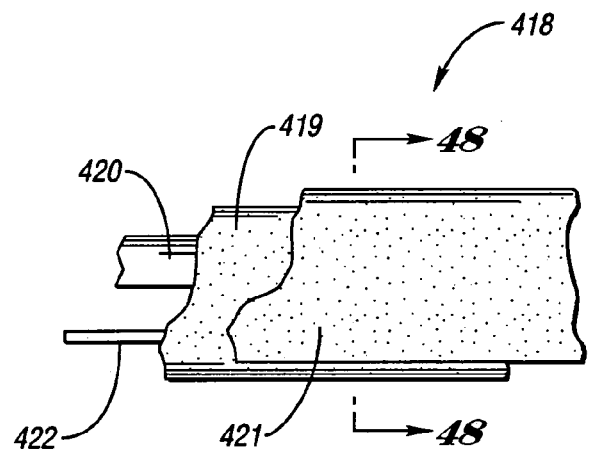
Fig. 48          Fig. 49
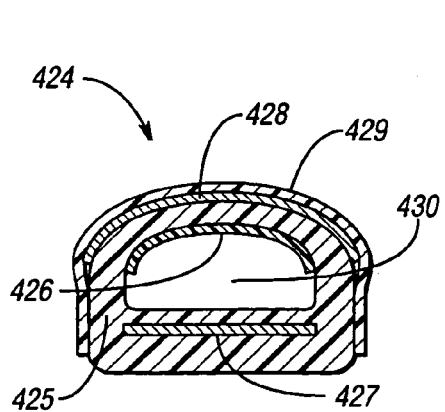
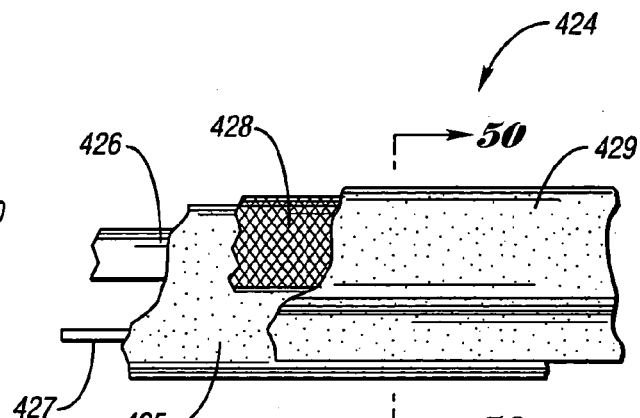
Fig. 50          Fig. 51

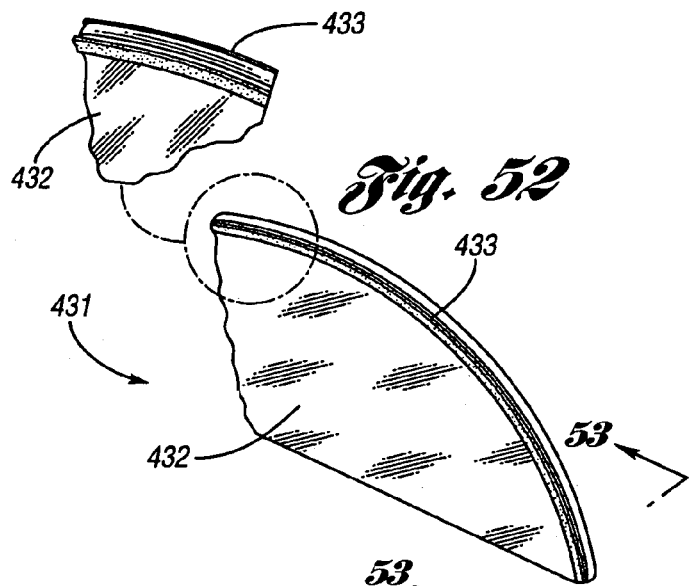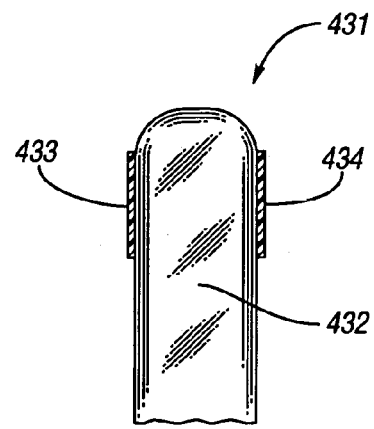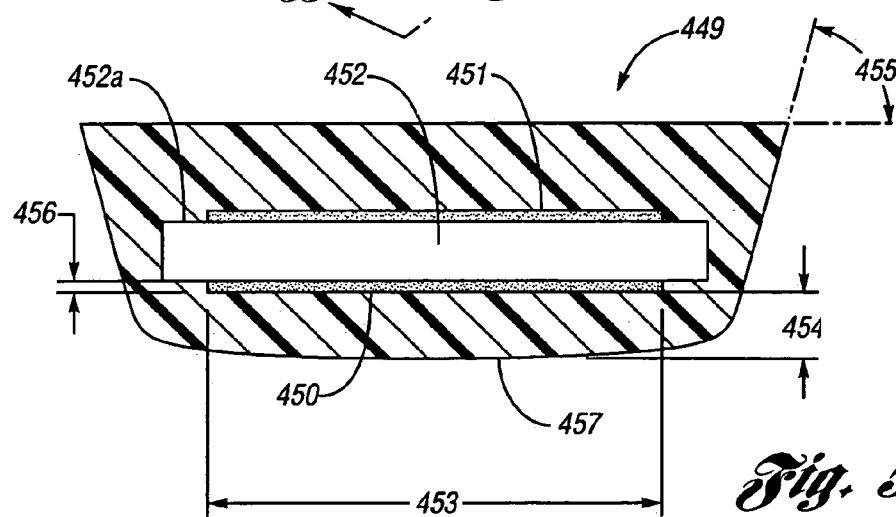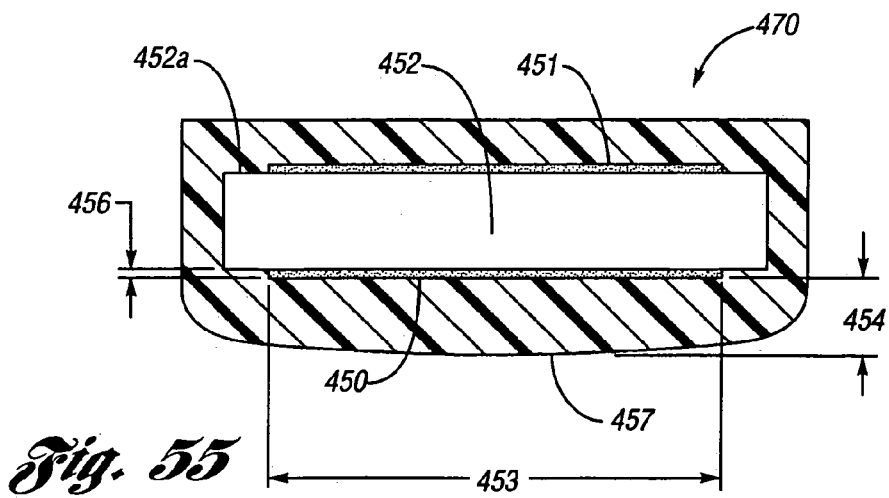

ANTI-ENTRAPMENT SYSTEMS FOR PREVENTING OBJECTS FROM BEING ENTRAPPED BY TRANSLATING DEVICES

CROSS-REFERENCE TO RELATED APPLICATIONS

This application is a continuation-in-part of U.S. application Ser. No. 10/262,446, filed Sep. 30, 2002, now U.S. Pat. No. 6,782,759, which is a continuation-in-part of U.S. application Ser. No. 09/901,883, filed on Jul. 9, 2001, now U.S. Pat. No. 6,499,359.

BACKGROUND OF THE INVENTION

1. Field of the Invention

The present invention relates to an anti-entrapment system provided with a capacitance sensor for preventing entrapment of an object.

2. Background Art

Anti-entrapment systems use various types of sensors to detect pinching of an object such as a human body part. For example, in automobiles, sensors are used for pinch sensing at electrically operated doors, windows, hatches, decks, hoods, lids, and the like.

A pinch sensor detects pinching an object by a translating device such as a window, door, sunroof, etc. In operation, the pinch sensor generates a pinch sensor signal in response to the object such as a person's finger being pinched by a translating device such as a window as the window is closing. In response to the pinch sensor signal, a controller controls the window to reverse direction and open in order to prevent further pinching of the person's finger. As the window is opening, the person may remove his finger from the window opening between the top edge of the window and the window liner.

Motor current sensors, infrared beam sensors, and continuous switch sensors have been used as pinch sensors in anti-entrapment systems. A problem with these types of pinch sensors is that they require a relatively large amount of pinching of the object to take place before they detect pinching of the object.

SUMMARY OF THE INVENTION

Accordingly, it is an object of the present invention to provide an anti-entrapment system having a sensor that detects a translating device pinching an object as soon as the translating device has applied a relatively small amount of pinching to the object and/or detects the presence of the object within an opening which may be closed by the translating device in order to prevent any pinching of the object by the translating device.

In carrying out the above object and other objects, the present invention provides an anti-entrapment system for preventing an object from being entrapped by a translating device. The system includes a capacitance sensor positioned adjacent to a translating device. The sensor has first and second electrical conductors separated by a separation distance, a compressible dielectric element interposed between the conductors, and an electrically non-conductive elastomer outer jacket encasing the conductors and the dielectric element.

The sensor has a capacitance dependent upon the separation distance between the conductors. The capacitance changes in response to the separation distance changing as a result of the dielectric element compressing in response to a first object touching the outer jacket, and changes in response to a second electrically conductive object coming into proximity with at least one of the conductors. A controller controls the translating device as a function of the capacitance in order to prevent the translating device from entrapping either object.

Further, in carrying out the above object and other objects, the present invention provides a second anti-entrapment system. The second system includes a capacitance sensor positioned adjacent to a translating device. The sensor has first and second electrical conductors separated by a separation distance, a dielectric element interposed between the conductors, and an electrically non-conductive elastomer outer jacket encasing the conductors and the dielectric element. The sensor has a capacitance dependent upon the separation distance between the conductors. The capacitance changes in response to a first electrically conductive object coming into proximity with at least one of the conductors. A controller controls the translating device as a function of the capacitance in order to prevent the translating device from entrapping the object.

Also, in carrying out the above object and other objects, the present invention provides a third anti-entrapment system. The third system includes a sensor positioned adjacent to a translating device. The sensor has an electrically non-conductive elastomer outer jacket having an interior filled with air, first and second electrically conductive elastomer carriers connected to opposite sides of the outer jacket and positioned within the air interior of the outer jacket, and first and second electrically conductive wires respectively sheathed in the first and second carriers. The carriers contact one another upon a compression force being applied to the outer jacket such that the configuration of the air interior changes and the carriers move towards and contact one another. A controller is connected to the wires for monitoring contact between the carriers. Upon such contact of the carriers the controller prevents the translating device from moving in a selected direction in order to prevent the translating device from entrapping an object. The third system further includes an elastomer base which a portion of the outer jacket rests against. The elastomer base has a higher compression force compared to the compression force of the outer jacket required for changing the configuration of the air interior thereby providing an over-travel feature to prevent inertia from the translating device from causing high forces against an entrapped object.

Further, in carrying out the above object and other objects, the present invention provides a fourth anti-entrapment system. The fourth system includes a sensor positioned adjacent to a translating device. The sensor has an electrically non-conductive elastomer outer jacket having an interior filled with an electrically conductive elastomer material, first and second electrically conductive elastomer carriers connected to opposite sides of the outer jacket and positioned within the interior of the outer jacket such that the carriers are separated from the elastomer material by respective air spaces, and first and second electrically conductive wires respectively sheathed in the first and second carriers. The carriers electrically contact one another via the elastomer material upon a compression force being applied to the outer jacket such that the configuration of the air spaces change and the carriers move towards and contact the elastomer material. A controller is connected to the wires for monitoring contact between the carriers and the elastomer material, wherein upon such contact the controller prevents the translating device from moving in a selected direction in order to prevent the translating device from entrapping an object. The elastomer material continues to compress after the carriers have contacted the elastomer material thereby providing an over-travel feature to prevent inertia from the translating device from causing high forces against an entrapped object.

Also, in carrying out the above object and other objects, the present invention provides a fifth anti-entrapment system. The fifth system includes a capacitance sensor positioned adjacent to a translating device. The sensor includes an electrically conductive elastomer outer jacket having an interior filled with a dielectric medium, an electrically non-conductive elastomer carrier held at each end by the outer jacket within the interior of the outer jacket, and an electrically conductive fabric sheathed within the carrier and an electrical conductor wire encased by the outer jacket such that the conductive fabric and the conductor wire are separated from one another by a separation distance. Capacitance of the sensor changes in response to the separation distance between the conductive fabric and the conductor wire changing as a result of the dielectric element compressing in response to a first object touching the outer jacket, and changes in response to a second electrically conductive object coming into proximity with at least one of the conductive fabric and the conductor wire. A controller is connected to the conductive fabric and the conductor wire for controlling the translating device as a function of the capacitance in order to prevent the translating device from entrapping either object.

Further, in carrying out the above object and other objects, the present invention provides a sixth anti-entrapment system. The sixth system includes a capacitance sensor positioned adjacent to a translating device. The sensor includes an electrically non-conductive elastomer outer jacket having an interior filled with a dielectric medium, a first electrically conductive fabric attached to the exterior surface of the outer jacket and covered with flexible electrically non-conductive flocking material, and a second electrically conductive fabric encased within the outer jacket at a position opposite to the first conductive fabric such that the conductive fabrics are separated from one another by a separation distance. Capacitance of the sensor changes in response to the separation distance between the conductive fabrics decreasing as a result of a first object touching the flocking material, and changes in response to a second electrically conductive object coming into proximity with the first conductive fabric. A controller is connected to the conductive fabrics for controlling the translating device as a function of the capacitance of the capacitance sensor in order to prevent the translating device from entrapping either object.

Also, in carrying out the above object and other objects, the present invention provides a seventh anti-entrapment system. The seventh system includes a capacitance sensor positioned adjacent to a translating device. The sensor includes an electrically non-conductive elastomer outer jacket having an interior filled with a dielectric medium, a flexible electrically non-conductive flocking material attached to the exterior surface of the outer jacket and a first electrically conductive fabric attached to the interior surface of the outer jacket, and a second electrically conductive fabric encased within the outer jacket at a position opposite to the first conductive fabric such that the conductive fabrics are separated from one another by a separation distance. Capacitance of the sensor changes in response to the separation distance between the conductive fabrics changing as a result of a first object touching the flocking material, and changes in response to a second electrically conductive object coming into proximity with the first conductive fabric. A controller is connected to the conductive fabrics for controlling the translating device as a function of the capacitance of the capacitance sensor in order to prevent the translating device from entrapping either object.

Further, in carrying out the above object and other objects, the present invention provides an eighth anti-entrapment system. The eighth system includes a capacitance sensor positioned adjacent to a translating device. The sensor includes an electrically non-conductive elastomer outer jacket having an interior filled with a dielectric medium, a first electrically conductive fabric attached to the interior surface of the outer jacket, a second electrically conductive fabric attached to the exterior surface of the outer jacket, and an electrically non-conductive flocking material covering the second conductive fabric on the exterior surface of the outer jacket. The sensor further includes a third electrically conductive fabric encased within the outer jacket at a position opposite to the first conductive fabric such that the first and third conductive fabrics are separated from one another by a separation distance. Capacitance of the sensor changes in response to the separation distance between the first and third conductive fabrics changing as a result of a first object touching the flocking material, and changes in response to a second electrically conductive object coming into proximity with the first conductive fabric. A controller is connected to the conductive fabrics for controlling the translating device as a function of the capacitance in order to prevent the translating device from entrapping either object.

Also, in carrying out the above object and other objects, the present invention provides a ninth anti-entrapment system. The ninth system includes an anti-pinch capacitance sensor strip positioned adjacent to a translating device. The sensor strip has first and second electrical conductors separated by a separation distance and a compressible dielectric element interposed between the conductors. The sensor strip has a capacitance dependent upon the separation distance between the conductors. The capacitance changes in response to the separation distance changing as a result of the dielectric element compressing in response to a first object touching the sensor, and changes in response to a second electrically conductive object coming into proximity with at least one of the conductors. A controller controls the translating device as a function of the capacitance in order to prevent the translating device from entrapping either object.

Further, in carrying out the above object and other objects, the present invention provides a tenth anti-entrapment system. The tenth system includes a capacitance sensor having first and second electrical conductor strips. The first conductor strip is positioned on one side of a translating device near a leading edge of the translating device and the second conductor strip is positioned on an opposite side of the translating device near the leading edge of the translating device. Capacitance of the sensor changes in response to an electrically conductive object coming into proximity with the leading edge of the translating device. A controller controls the translating device as a function of the capacitance in order to prevent the translating device from entrapping the object.

The above object and other objects, features, and advantages of the present invention are readily apparent from the following detailed description of the preferred embodiment(s) when taken in connection with the accompanying drawings.

BRIEF DESCRIPTION OF DRAWINGS

FIG. 1A illustrates a block diagram of an anti-entrapment system in accordance with the present invention;

FIG. 1B illustrates a block diagram of the anti-entrapment system in which the sensor and controller are integrated;

FIG. 2 illustrates a first embodiment of the sensor of the anti-entrapment system;

FIG. 3 illustrates a cross-sectional view of the sensor taken along the line 3—3 of FIG. 2;

FIG. 4A illustrates the operation of the sensor of the anti-entrapment system for detecting the proximity of an object to the sensor;

FIG. 4B illustrates the operation of the sensor of the anti-entrapment system for detecting an object touching the sensor;

FIG. 10 illustrates the placement of the sensor of the anti-entrapment system for use in an automobile deck lid environment;

FIGS. 11A and 11B illustrate the placement of the sensor of the anti-entrapment system for use in a hatchback environment;

FIG. 22 illustrates a fifth embodiment of the sensor of the anti-entrapment system;

FIG. 23 illustrates a cross-sectional view of the sensor shown in FIG. 22 taken along the line 23—23 of FIG. 22;

FIG. 24 illustrates a sixth embodiment of the sensor of the anti-entrapment system;

FIG. 25 illustrates a cross-sectional view of the sensor shown in FIG. 24 taken along the line 25—25 of FIG. 24;

FIG. 26 illustrates a seventh embodiment of the sensor of the anti-entrapment system;

FIG. 27 illustrates a cross-sectional view of the sensor shown in FIG. 26 taken along the line 27—27 of FIG. 26;

FIG. 28 illustrates an eighth embodiment of the sensor of the anti-entrapment system;

FIG. 29 illustrates a cross-sectional view of the sensor shown in FIG. 28 taken along the line 29—29 of FIG. 28;

FIG. 30 illustrates a ninth embodiment of the sensor of the anti-entrapment system;

FIG. 31 illustrates a cross-sectional view of the sensor shown in FIG. 30 taken along the line 31—31 of FIG. 30;

FIG. 46 illustrates a cross-sectional view of a $14^{th}$ embodiment of the sensor of the anti-entrapment system taken along the line 46—46 of FIG. 47;

FIG. 47 illustrates a profile view of the sensor shown in FIG. 46;

FIG. 48 illustrates a cross-sectional view of a $15^{th}$ embodiment of the sensor of the anti-entrapment system taken along the line 48—48 of FIG. 49;

FIG. 49 illustrates a profile view of the sensor shown in FIG. 48;

FIG. 50 illustrates a cross-sectional view of a $16^{th}$ embodiment of the sensor of the anti-entrapment system taken along the line 50—50 of FIG. 51;

FIG. 51 illustrates a profile view of the sensor shown in FIG. 50;

FIG. 52 illustrates a cross-sectional view of a 17$^{th}$ embodiment of the sensor of the anti-entrapment system taken along the line 52—52 of FIG. 53;

FIG. 53 illustrates a profile view of the sensor shown in FIG. 52;

FIG. 54 illustrates a cross-sectional view of an 18$^{th}$ embodiment of the sensor of the anti-entrapment system;

FIG. 55 illustrates a cross-sectional view of a 19$^{th}$ embodiment of the sensor of the anti-entrapment system;

DETAILED DESCRIPTION OF THE PREFERRED EMBODIMENT(S)

Figure 5:
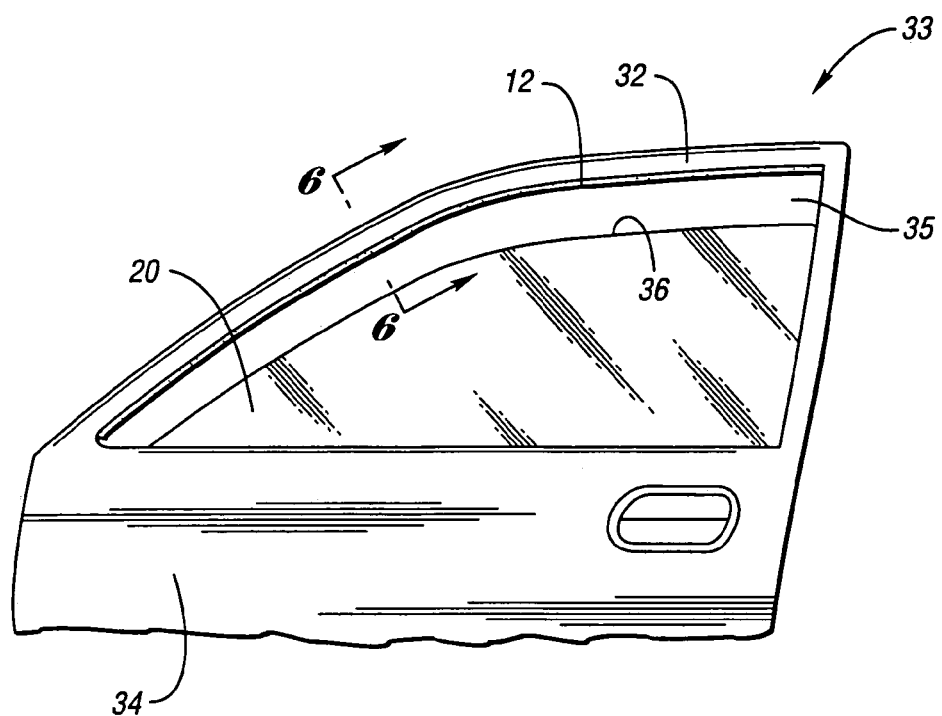
FIG. 5 illustrates the placement of the sensor of the anti-entrapment system for use in an automobile door-window environment.

Referring now to FIG. 1A, an anti-entrapment system 10 in accordance with the present invention is shown. Anti-entrapment system 10 includes a sensor 12 and a controller 14. Sensor 12 is a capacitance sensor that is operable to detect touching by an object 16 to the sensor and/or the presence of the object near the sensor. In response to an object 16 touching sensor 12, the capacitance of the sensor changes. Likewise, in response to an object 16 that is electrically conductive, including the human body, coming within the proximity of sensor 12, the capacitance of the sensor changes even without the object actually touching, or applying any force, to the sensor. This provides for zero force detection of a human body part before contact is made to the body part. As such, sensor 12 is a contact and a non-contact sensor.

Controller 14 controls a motor 18 associated with a translating device 20 such as a window, sliding door, sunroof, etc. in order to move the translating device between opened and closed positions. Controller 14 controls motor 18 to move translating device 20, i.e., window, in an opening direction when an opening provided by the window is desired. Similarly, controller 14 controls motor 18 to move window 20 in a closing direction in order to close off the window opening.

Generally, an operator actuates a switch to have controller 14 control the opening and closing of window 20. Such a switch may be configured to provide express-up (i.e., express close) and express-down (i.e., express open) functionality such that a single switch actuation (as opposed to a continuous actuation) causes controller 14 to control window 20 until the window has fully moved into its opened or closed position.

Sensor 12 is placed adjacent to a window opening provided by window 20. Sensor 12 monitors the window opening to determine whether an object 16 such as a person's hand or finger is near or extends through the window opening. As can be appreciated, a problem with object 16 extending through the window opening is that when window 20 moves in the closing direction and closes off the window opening, the window will pinch the object unless the object is removed from the window opening.

Sensor 12 is placed adjacent to the window opening such that object 16 touches the sensor and/or becomes in close proximity to the sensor if the object is caught between the window opening and window 20 and is about to be pinched by the window. Sensor 12 generates a pinch sensor signal 21 in response to object 16 touching the sensor and generates a proximity sensor signal 23 in response to the object being in close proximity to the sensor. Sensor 12 provides pinch and proximity sensor signals 21 and 23 to controller 14. In response to receiving either of pinch and proximity sensor signals 21 and 23, controller 14 controls window 20 via motor 18 accordingly.

For instance, if the operator has actuated the switch to have controller 14 close window 20 and the window is now closing (for example, when the window is in express-up operation), the controller controls the window to stop closing and open in response to a subsequent detection by sensor 12 of object 16 within the window opening. Reversing the direction of window 20 and opening the window causes the window opening to increase in order to prevent any pinching of the object and to give time for the object to be removed from the window opening. Similarly, if sensor 12 detects the presence of object 16 within window opening, then controller 14 prevents window 20 from subsequently moving in the closing direction until the object has been removed from the window opening.

Referring now to FIG. 1B, sensor 12 and controller 14 may be integrated with one another to form a sensor/controller 13. Sensor/controller 13 effectively provides the same function as non-integrated sensor 12 and controller 14. As such, in this document, the description regarding sensor 12 and controller 14 also refers to the sensor and controller functionality provided by sensor/controller 13.

It is to be appreciated that controller 14 can have switch inputs, communications capability with other sensors and controllers, and various outputs for controlling and monitoring various aspect of window 20. For instance, controller 14 can have sensor inputs for motor 18 as designated by line 19 in FIG. 1A or other moving members to determine the position, direction of movement, speed of movement, etc. of window 20. Such sensor inputs could be for receiving signals from Hall Effect sensors and the like such as optic and resistive sensors.

In the case of controller 14 receiving sensor signals responsive to motor 18 or other moving members, the controller would have additional anti-entrapment capabilities by making use of motor current and/or commutator pulses and/or sensor signals from Hall (or other type) sensors. This would have the added benefit of being able to detect obstructions while the moving member and the obstruction are too far away from sensor 12 to be sensed by sensor 12.

Referring now to FIGS. 2 and 3, a first embodiment of sensor 12 is shown. Sensor 12 includes a flexible center conductive element or core 22 coaxially surrounded by a non-conductive compressible element or layer 26 that is in turn coaxially surrounded by a flexible outer conductive element or layer 24. Non-conductive compressible layer 26 separates conductive core 22 and conductive layer 24. Conductive core 22 is electrically grounded for sensor 12. An elastomeric overcoat 28 covers conductive layer 24.

Conductive core 22 and conductive layer 24 are made from conductive materials such as aluminum, copper, and the like. Conductive core 22 and conductive layer 24 may also be made from materials such as nylon, polyester, and the like that have been plated or metalized with a conductive material such as aluminum, copper, nicked, and the like. Conductive core 22 and conductive layer 24 each may be a braided mesh or a metalized woven fabric which gives the conductive core and the conductive layer their flexibility. Conductive core 22 and conductive layer 24 may also be a plated woven fabric that has as a metalization coating of copper, for proper conductivity, with a nickel coating over the copper, for corrosion resistance. Non-conductive compressible layer 26 may be an EPDM closed cell foam having a high dielectric constant and a low compressible force. The dielectric constant and/or compressibility of non-conductive layer 26 may be changed by using different types of materials. For instance, non-conductive layer 26 may simply be air. Elastomeric overcoat 28 may be made from elastomeric rubbers, like vinyl, thermo-plastic elastomers such as Santoprene, Neoprene, Buna N, and the like. Elastomeric overcoat 28 could also be felt fabric and the like. Elastomeric overcoat 28 may be semi-rigid, flexible, and/or compressible and may incorporate sealing elements, adhesives, and other attachments.

Referring now to FIG. 4A with continual reference to FIG. 1, the operation of sensor 12 for determining the presence of an object within the proximity of the sensor will now be described in more detail. Sensor 12 is mounted to a fixed assembly such as an automobile window body panel 32. Sensor 12 can also be embodied in the automobile window weather-strip and the like. In FIG. 4A, an electrically conductive object 30 such as a human body part is placed in the window opening between window 20 and sensor 12. As shown, the window opening is sufficiently large enough such that object 30 can move freely in the window opening without being pinched by window 20. If the window opening becomes smaller as the result of window 20 closing such that object 30 becomes proximal to sensor 12 and into the capacitive field surrounding conductive layer 24, then the capacitance of the sensor changes.

Sensor 12 then generates proximity sensor signal 23 indicative of this change in capacitance to controller 14. Controller 14 processes proximity sensor signal 23 to determine that the capacitance of sensor 12 has changed as a result of object 30 being proximal to sensor 12 and is about to be pinched by window 20. Controller 14 then controls motor 18 to open window 20 and reverse its movement away from window body panel 32 thereby increasing the window opening and allowing object 30 to be removed from the window opening without any pinching of the object by the window.

Referring now to FIG. 4B with continual reference to FIG. 1, the operation of sensor 12 for detecting an object touching the sensor will now be described in more detail. In FIG. 4B, window 20 starts to close in the direction of the arrow towards window body panel 32 and the window opening becomes smaller such that a non-electrically conductive object 31 is between sensor 12 and window 20 and touches the sensor. In response to object 31 touching sensor 12, the sensor compresses such that the distance between conductive core 20 and conductive layer 24 becomes smaller. As a result of this distance becoming smaller, the capacitance of sensor 12 changes.

Sensor 12 then generates pinch sensor signal 21 indicative of this change in capacitance to controller 14. Controller 14 processes pinch sensor signal 21 to determine that the capacitance of sensor 12 has changed as a result of object 31 touching the sensor and is about to be pinched by window 20. Controller 14 then controls motor 18 to open window 20 and reverse its movement away from window body panel 32 thereby increasing the window opening and allowing object 31 to be removed from the window opening without any pinching of the object by the window. It is to be appreciated that an electrically conductive object such as object 30 may also touch sensor 12 and, in this case, the sensor likewise compresses and generates a pinch sensor signal indicative of the resulting change in capacitance.

Controller 14 may be an electronic controller such as a microprocessor based controller that includes a digital to analog (DAC) converter. The DAC converter allows for the subtraction (or an addition) of an offset voltage to allow for greater amplification of pinch and proximity sensor signals 21 and 23. Alternative embodiments could include analog waveform generation, such as a triangle wave, to accomplish the determination of the magnitude of the offset voltage for subsequent subtraction (or addition) thereof. The microprocessor of controller 14 may execute software for filtering and may use algorithms for adaptive threshold detection enabling determination of object proximity to sensor 12 or compression of the sensor as a result of the object touching the sensor. In further alternative embodiments, the microprocessor of controller 14 may be substituted with discrete electronic, hybrid electronics, or a custom application specific integrated circuit that may include microprocessor core analog and digital circuitry.

Controller 14 may also incorporate system functions such as functions of a vehicle door system. Such door system functions include functions associated with power mirrors, such as movement, electrochromatic control, turn signal indication, and heating control; power door locks; keyless entry systems; personalization settings, such as driver 1 and driver 2; and the like. In this instance, controller 14 uses a microcontroller with serial communications, via wires, optic fibers, or wireless such as RF wireless, to communicate with other control modules located within a vehicle. The use of such a controller eliminates the redundancy of multiple modules in a door system. In this instance, controller 14 can be integrated with the window lift motor, or be a separate module that is wired to items controlled by the module.

Controller 14 may also incorporate other system functions based on mounting locations other than a vehicle door. Functions associated with mounting locations such as the dashboard, center console, or seat may be integrated into the module. Functions such as steering wheel and steering column adjustments, seat position settings, seat heating and cooling, global positioning and internet communications, and pedal adjustment.

Referring now to FIG. 5, the placement of sensor 12 of anti-entrapment system 10 for use in an automobile door-window environment 33 is shown. Automobile door-window environment 32 includes a door 34 and a window body panel 32. Window 20 automatically moves down and up to open and close with respect to window body panel 32. In an opened position, window 20 forms a window opening 35 between a top edge 36 of the window and window body panel 32. Sensor 12 is placed along window body panel 32. As described above, sensor 12 is operable to detect the presence of an object extending through window opening 35 that is adjacent to the sensor and/or is touching the sensor. Such capability enables sensor 12 to function in conjunction with controller 14 to prevent window 20 from pinching the object as the window closes off window opening 35.

Figure 6A:
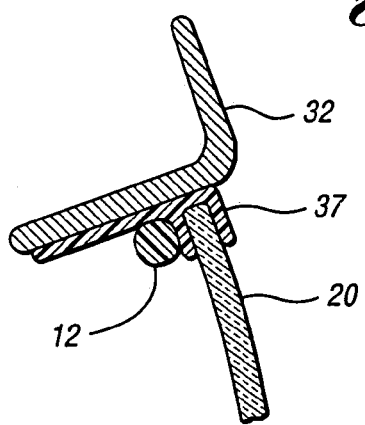
FIG. 6A illustrates a cross-sectional view of a first placement of the sensor in the automobile door-window environment taken along the line 6—6 of FIG. 6.

FIG. 6A illustrates a cross-sectional view of a first placement of sensor 12 relative to window 20 and window body panel 32. Sensor 12 is placed within the interior of the automobile adjacent to window body panel 32 and a window weather strip 37. Window weather strip 37 is attached to window body panel 32 and seals off window 20 when the window moves to its fully closed position as shown in FIG. 6A.

Figure 6B:
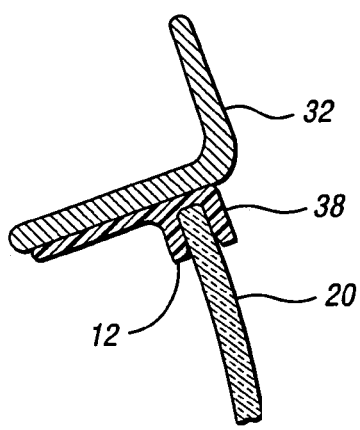
FIG. 6B illustrates a cross-sectional view of a second placement of the sensor in the automobile door-window environment taken along the line 6—6 of FIG. 6.
Figure 7:
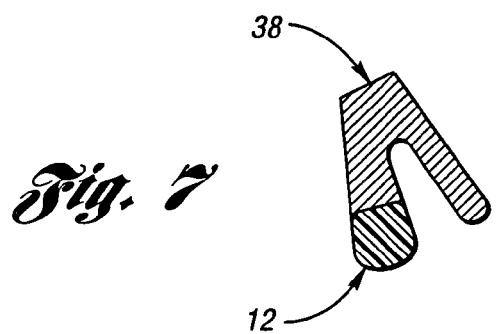
FIG. 7 illustrates in greater detail the sensor placement shown in FIG. 6B.

FIG. 6B illustrates a cross-sectional view of a second placement of sensor 12 relative to window 20 and window body panel 32. Sensor 12 is formed integral with a window weather strip 38 which is attached to window body panel 32. FIG. 7 illustrates in greater detail the integration of sensor 12 within window weather strip 38.

Figure 8:
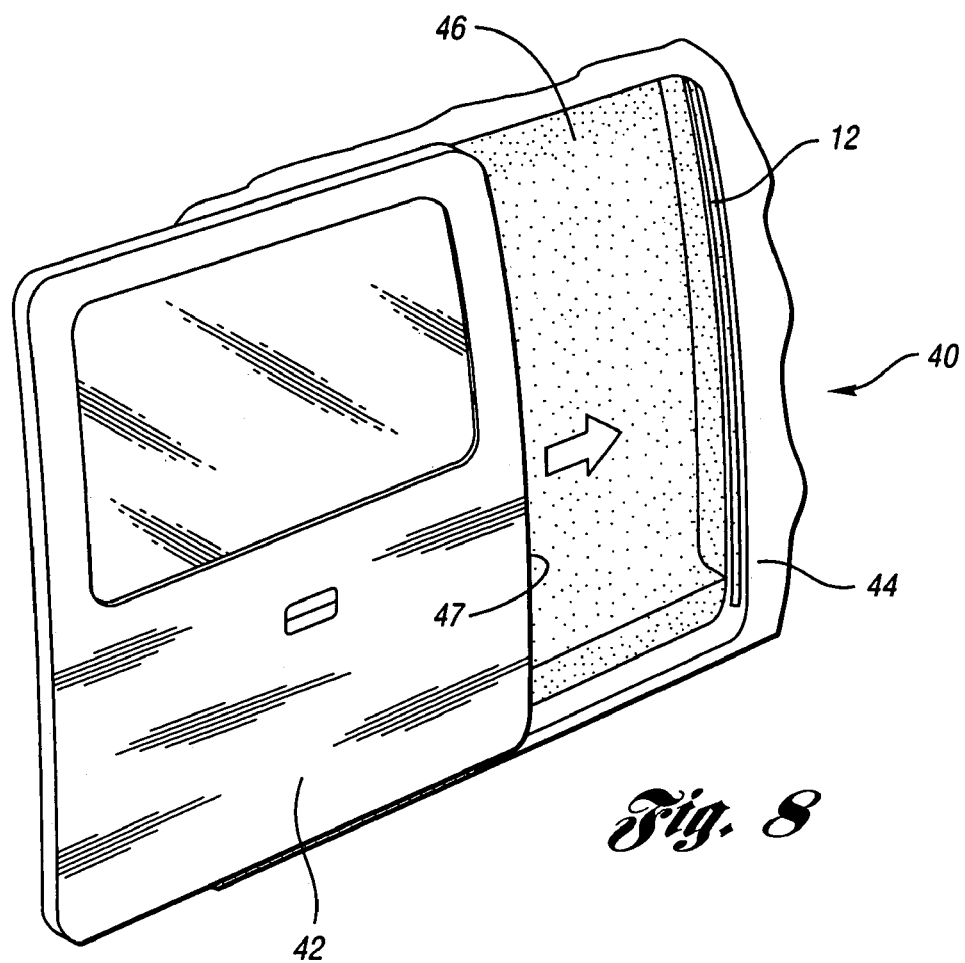
FIG. 8 illustrates the placement of the sensor of the anti-entrapment system for use in an automobile sliding-door environment.

Referring now to FIG. 8, the placement of sensor 12 of anti-entrapment system 10 for use in an automobile sliding-door environment 40 is shown. Automobile sliding-door environment 40 includes an electrically operated sliding door 42 and an automobile door body panel 44. Sliding door 42 moves horizontally to open and close with respect to door body panel 44. In an opened position, sliding door 42 forms a door opening 46 between a leading edge 47 of the sliding door and door body panel 44. Sensor 12 is placed along door body panel 44 in a manner analogous to the placement of the sensor as shown in either FIG. 6A or FIG. 6B. Sensor 12 may also be mounted on sliding door 42 instead of door body panel 44. Sensor 12 detects the presence of an object extending through sliding door opening 46 that is adjacent to the sensor and/or is touching the sensor. In response to sensor 12 detecting an object extending through door opening 46, controller 14 prevents sliding door 42 from pinching the object as the sliding door moves in the direction of the illustrated arrow and closes off door opening 46.

Figure 9:
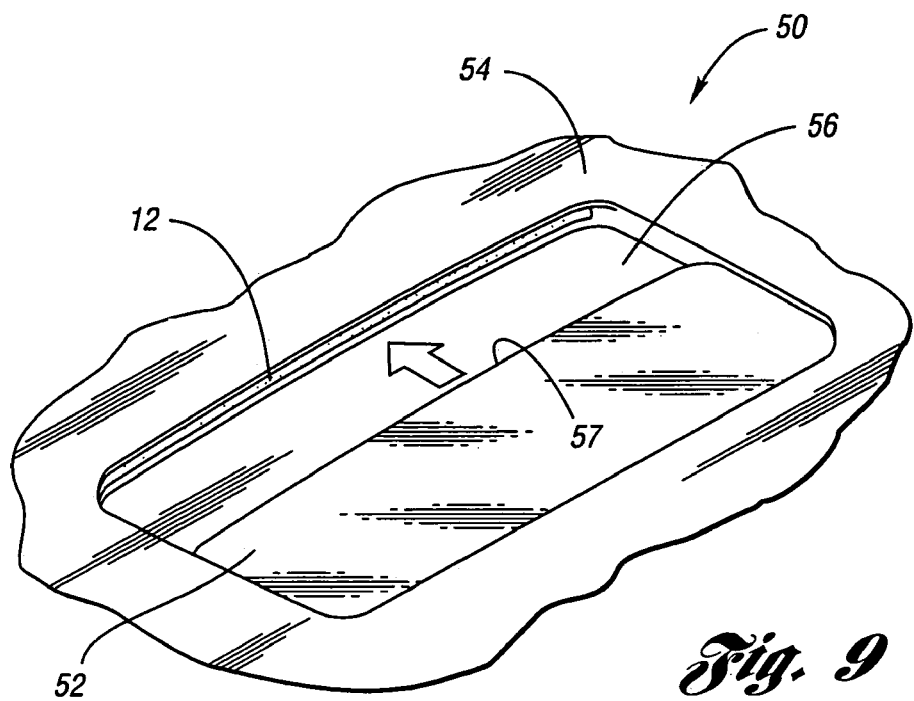
FIG. 9 illustrates the placement of the sensor of the anti-entrapment system for use in an automobile sunroof environment.
Figure 12:
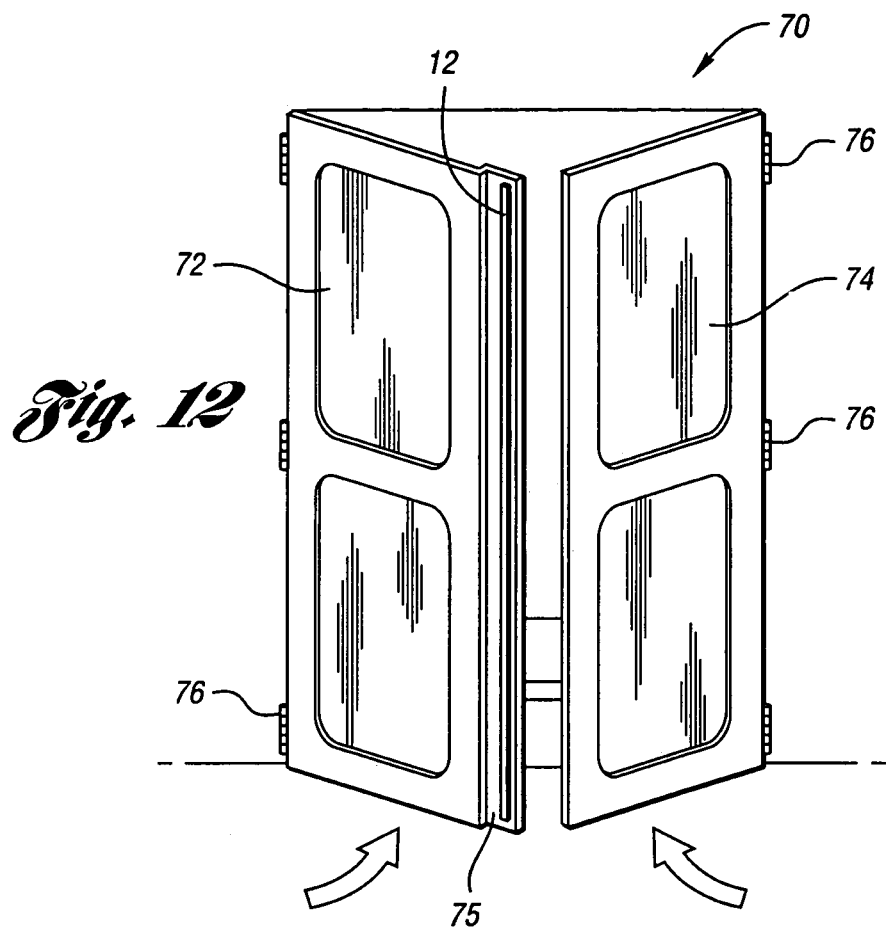
FIG. 12 illustrates the placement of the sensor of the anti-entrapment system for use in an automated bus door environment.

Referring now to FIG. 9, the placement of sensor 12 of anti-entrapment system 10 for use in an automobile sunroof environment 50 is shown. Automobile sunroof environment 50 includes an electrically operated sliding sunroof 52 and an automobile roof 54. Sunroof 52 moves horizontally with respect to roof 54 to form and close an opening 56 in the roof. In an opened position, sunroof 52 forms roof opening 56 between a leading edge 57 of the sunroof and roof 54. Sensor 12 is placed along roof 54 in a manner analogous to the placement of the sensor as shown in either FIG. 6A or FIG. 6B. As described above, sensor 12 is operable to detect the presence of an object extending through roof opening 56 that is adjacent to the sensor and/or is touching the sensor. Such capability enables sensor 12 to function in conjunction with controller 14 to prevent sunroof 52 from pinching the object as the sunroof closes off roof opening 56.

Referring now to FIG. 10, the placement of sensor 12 of anti-entrapment system 10 for use in an automobile deck lid environment 60 is shown. Automobile deck lid environment 60 includes an electrically operated deck lid 62. Deck lid 62 opens and closes with respect to an automobile trunk 64. Sensor 12 is placed along an edge 65 of trunk 64 in a manner analogous to the placement of the sensor as shown in either FIG. 6A or FIG. 6B. As described above, sensor 12 detects the presence of an object extending from the exterior of trunk 64 into the interior of the trunk as a result of such object being adjacent to the sensor and/or touching the sensor. Sensor 12 provides appropriate sensor signals to controller 14 in order to prevent deck lid 62 from pinching the object as the deck lid closes off trunk 64.

In addition to the automobile applications described above, anti-entrapment system 10 may also be used in other automobile applications including those involving tonneau covers and hatchback doors. For instance, as shown in FIGS. 11A and 11B, the placement of sensor 12 for use in an automobile hatchback environment 66 is shown. Automobile hatchback environment 66 includes a hatch 67 and an automobile body panel 68. A cylinder 69 connects hatch 67 and automobile body panel 68. Cylinder 69 includes a piston rod which extends to move hatch 67 to an opened position with respect to body panel 68 and contracts to move the hatch to a closed position with respect to the body panel (the hatch in the closed position is shown as a dotted line in FIG. 11A). Sensor 12 is placed along body panel 68. Sensor 12 detects the presence of an object extending in the opening between hatch 67 and body panel 68 that is adjacent to the sensor and/or is touching the sensor. Controller 14 is then able to control cylinder 69 to prevent hatch 67 from pinching the object as the hatch is being closed.

Referring now to 12, the placement of sensor 12 for use in an automated bus door environment 70 is shown. Automated bus door environment 70 includes a pair of electrically operated doors 72 and 74. Hinges 76 power doors 72 and 74 to automatically open and close. When closing, door 72 closes prior to door 74 such that door 74 overlaps door 72 when both doors are closed. Sensor 12 is placed along an edge 75 of door 72 and may be incorporated into a door weather strip. Sensor 12 detects the presence of an object extending into the door opening as a result of such object being adjacent to the sensor and/or touching the sensor. Sensor 12 functions in conjunction with controller 14 to prevent door 74 from pinching the object as door 74 closes following the closing of door 72.

Figure 13:
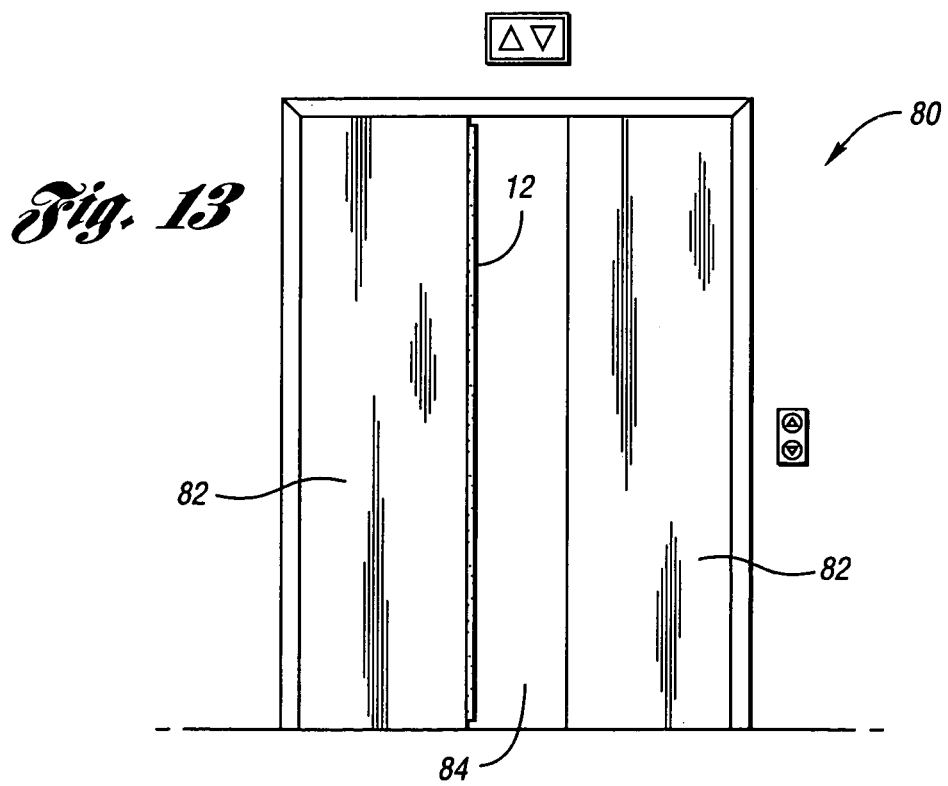
FIG. 13 illustrates the placement of the sensor of the anti-entrapment system for use in an elevator door environment.
Figure 14:
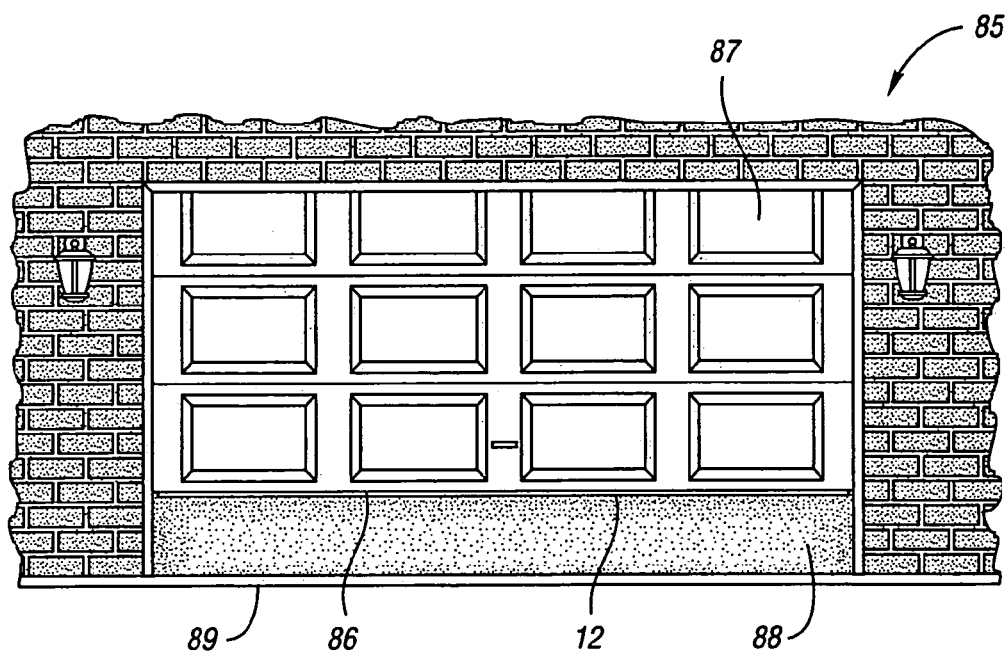
FIG. 14 illustrates the placement of the sensor of the anti-entrapment system for use in a garage door environment.

In addition to automobile applications, anti-entrapment system 10 may also be used in industrial applications. For instance, FIGS. 13 and 14 illustrate the placement of sensor 12 of anti-entrapment system 10 for use in an elevator door environment 80 and a garage door environment 85, respectively. Elevator door environment 80 is a specific application of a general sliding door environment. In elevator door environment 80, sensor 12 is placed on a leading edge of either elevator door 82. Elevator doors 82 are shown partially opened with an elevator door opening 84 therebetween. Sensor 12 detects the presence of an object extending between elevator doors 82 as a result of such object being adjacent to the sensor and/or touching the sensor. Sensor 12 generates an appropriate sensor signal for controller 14 in order to prevent elevator doors 82 from pinching the object as the doors slide close.

In garage door environment 85, sensor 12 is placed along a bottom edge 86 of a garage door 87. Garage door 87 is shown partially opened with a garage door opening 88 between bottom edge 86 of the garage door and the driveway 89 leading into the garage. Sensor 12 detects the presence of an object extending within garage door opening 88 as a result of such object being adjacent to the sensor and/or touching the sensor. Sensor 12 generates an appropriate sensor signal for controller 14 in order to prevent garage door 87 from pinching the object as the garage door closes.

Figure 15:
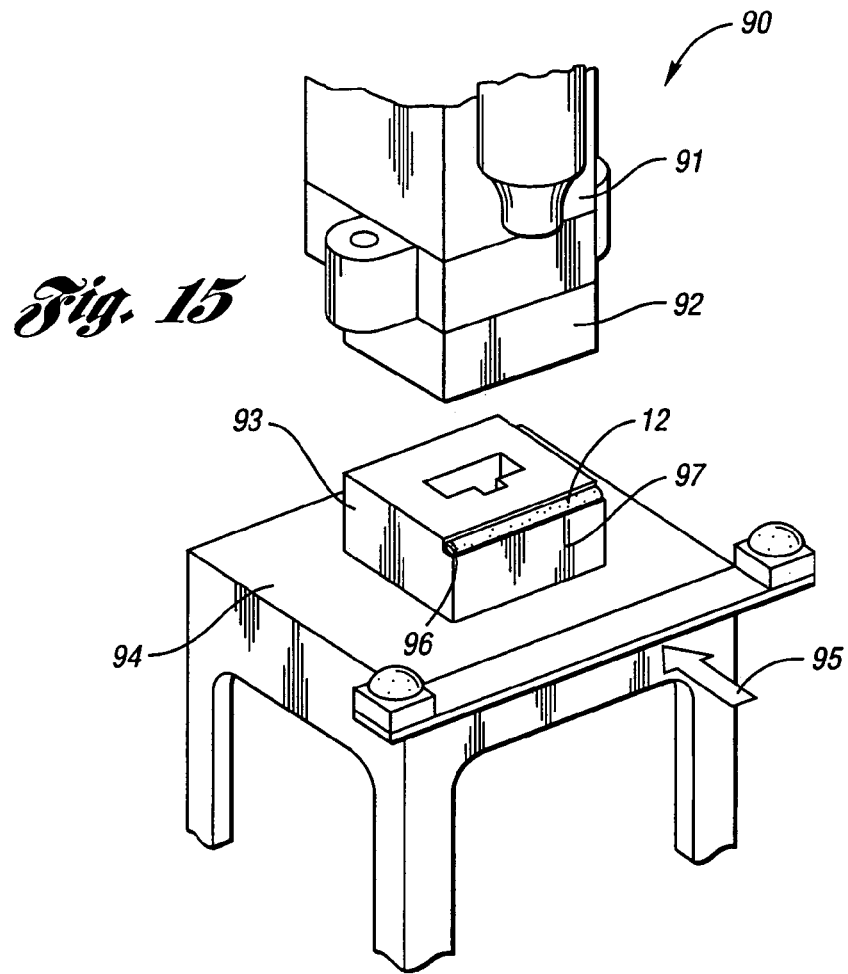
FIG. 15 illustrates the placement of the sensor of the anti-entrapment system for use with an industrial machine.

FIG. 15 illustrates the placement of sensor 12 of anti-entrapment system 10 for use with an industrial machine 90. Industrial machine 90 includes a press machine ram mechanism 91 having an upper press tooling die 92. A lower press tooling die 93 is fixed on a press machine platen 94. Ram mechanism 91 is movable to force upper press tooling die 92 against lower press tooling die 93. During operation, a press operator faces industrial machine 90 in the direction of arrow 95. Sensor 12 is placed within a cavity 96 formed on a front edge 97 of lower press tooling die 93. As such, sensor 12 is positioned to face the press operator. Within cavity 96, sensor does not come into contact with upper press tooling die 92 as this tooling die closes on lower press tooling die 93. During operation of industrial machine 90, sensor 12 detects the presence of an object touching the sensor and/or the presence of a conductive object such as a finger within the proximity of the sensor. Sensor 12 then generates an appropriate sensor signal for controller 14 in order to prevent upper press tooling die 92 from slamming on a foreign object within the vicinity of lower press tooling die 93.

Figure 16:
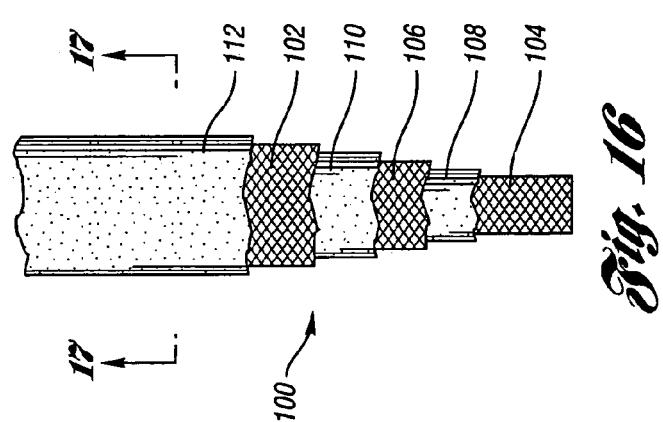
FIG. 16 illustrates a second embodiment of the sensor of the anti-entrapment system.

Referring now to FIG. 16, a sensor 100 in accordance with a second sensor embodiment is shown. Sensor 100 is similar to sensor 12 but includes a third flexible conductive element 102 that coaxially surrounds first and second flexible conductive elements 104, 106. Sensor 100 includes a non-conductive compressible coaxial element 108 surrounding first conductor 104 and a non-conductive compressible coaxial element 110 surrounding second conductor 106. An outer elastomeric coating 112 coaxially surrounds third conductor 102. Non-conductive compressible elements 108 and 110 may be made from the same closed cell foam or other compressible material. Like first and second conductors 104, 106, third conductor 102 may also be a braided wire mesh made from a conductive material. Second conductor 106 is electrically grounded.

Figure 17:
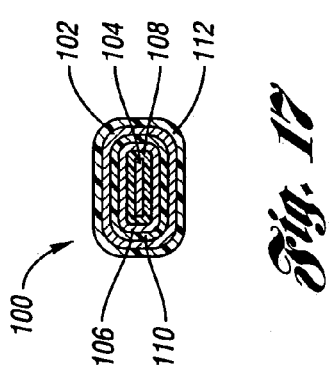
FIG. 17 illustrates a cross-sectional view of the sensor shown in FIG. 16 taken along the line 17—17 of FIG. 16.

Referring now to FIG. 17, a cross-sectional view of sensor 100 is shown. A semi-rigid elastomer 110 is used in place of coaxial non-conductive compressible layer 110. Semi-rigid elastomer 110 allows for faster change in capacitance of first and second conductors 104, 106 in the event of an object being in contact with outer coating 112. The distance between third and second conductors 102, 106 and the proximity of an electrically conductive object to third conductor 102 determine the capacitance of the third and second conductors. The distance between first and second conductors 104, 106 determine the capacitance of the first and second conductors. Thus, sensor 100 is a dual-purpose sensor in that it can detect an object in proximity to the sensor and it can detect an object touching the sensor as a function of the corresponding change in capacitance.

Figure 18:
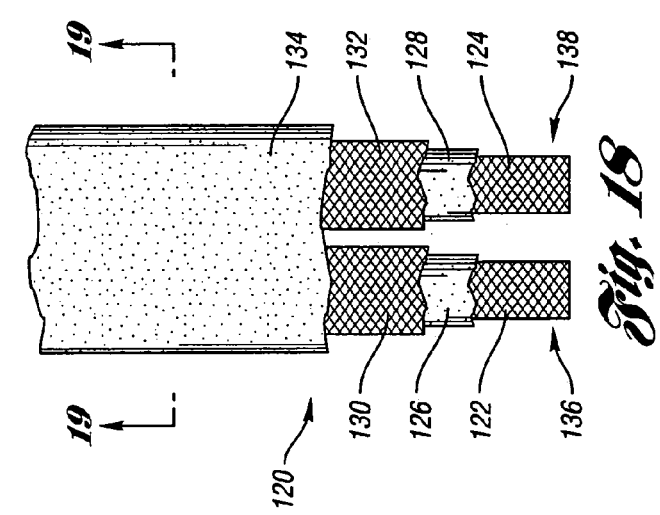
FIG. 18 illustrates a third embodiment of the sensor of the anti-entrapment system.
Figure 19:
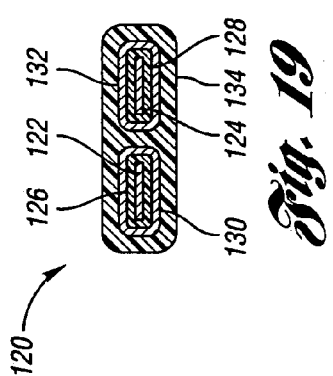
FIG. 19 illustrates a cross-sectional view of the sensor shown in FIG. 18 taken along the line 19—19 of FIG. 18.

Referring now to FIGS. 18 and 19, a sensor 120 in accordance with a third sensor embodiment is shown. Sensor 120 includes two longitudinally parallel flexible conductor core elements 122 and 124 separated by a distance. Two non-conductive compressible coaxial elements 126 and 128 (or semi-rigid elastomers) individually surround respective conductor core elements 122 and 124. Two flexible conductor elements 130 and 132 which are separated by a distance coaxially surround respective non-conductive compressible elements 126 and 128. A semi-rigid elastomeric outer coating 134 encases conductive elements 130 and 132.

Sensor 120 is essentially two sensors 136 and 138. Sensor 136 includes elements 122, 126, 130, and 134. Sensor 138 includes elements 124, 128, 132, and 134. Sensor 136 is configured as a contact sensor (i.e., pinch sensor) such that an object must be in contact with the sensor to cause the distance between conductor elements 122 and 130 to be reduced thereby causing a change in capacitance between conductor elements 122 and 130 that can be used by controller 14. As such, outer conductor element 130 is electrically grounded.

Sensor 138 is configured as a non-contact sensor (i.e., proximity sensor) such that an electrically conductive object that is proximal to outer conductor element 132 causes a change in capacitance between conductor elements 124 and 132 that can be used by controller 14. As such, inner conductor element 124 is electrically grounded. Thus, sensor 120 detects objects in contact with sensor 120 as well as detects electrically conductive objects in proximity to sensor 120.

Figure 20:
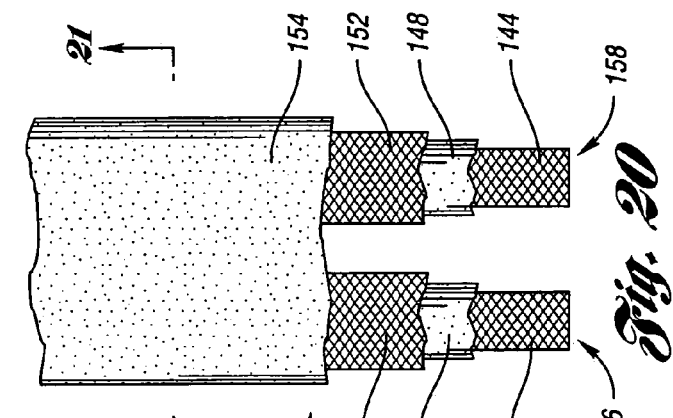
FIG. 20 illustrates a fourth embodiment of the sensor of the anti-entrapment system.
Figure 21:
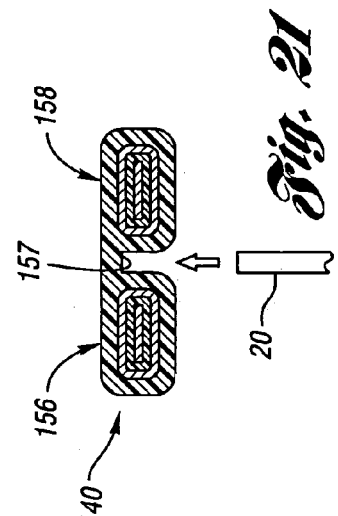
FIG. 21 illustrates a cross-sectional view of the sensor shown in FIG. 20 taken along the line 21—21 of FIG. 20.

Referring now to FIGS. 20 and 21, a sensor 140 in accordance with a fourth sensor embodiment is shown.

Sensor 140 includes two longitudinally parallel flexible conductor elements 142 and 144 separated by a distance. Two compressible coaxial elements 146 and 148 (or semi-rigid elastomers) individually surround respective conductor core elements 122 and 124. Two metal braided flexible conductor elements 150 and 152 which are separated by a distance coaxially surround respective non-conductive compressible elements 146 and 148. A semi-rigid elastomeric outer coating 154 encases conductor elements 150 and 152.

Sensor 140 is essentially two sensors 156 and 158. Sensor 156 includes elements 142, 146, 150, and 154. Sensor 158 includes elements 144, 148, 152, and 154. As shown in FIG. 21, outer coating 154 is configured to provide for an entry port 157 for receiving a top edge of a translating device 20 such as a window when the window moves in a closing direction to the closed position. In the closed position, sensors 156 and 158 are located on respective sides of window 20. As such, sensor 140 provides detection of objects that are proximal and/or in contact from multiple directions.

Referring now to FIGS. 22 and 23, a sensor 160 in accordance with a fifth sensor embodiment is shown. Sensor 160 includes an inner flexible conductor 162. A hollow non-conductive flexible spanner 164 holds inner flexible conductor 162 to form lower and upper spanner spaces 166 and 168. Spanner spaces 166 and 168 are filled with air or other dielectric medium. A metal braided outer conductor element 170 coaxially surrounds spanner 164. A semi-rigid elastomer outer jacket 172 encases conductor element 170. Sensor 160 registers a change in capacitance whenever the distance between outer conductor element 170 and inner conductor element 162 changes as a result of an object touching outer jacket 172 and/or as a result of an electrically conductive object coming into proximity with the outer conductor.

Referring now to FIGS. 24 and 25, a sensor 180 in accordance with a sixth sensor embodiment is shown. Sensor 180 includes first and second flexible conductive metal wires 182 and 184. A non-conductive flexible spanner 186 holds first conductor 182. A conductive elastomeric outer jacket 188 having a hollow interior holds and encases second conductor 184 and holds each end of spanner 186. Spanner 186 divides the interior of outer jacket 188 into two spaces 190 and 192. Spaces 190 and 192 are filled with air or other dielectric medium. Sensor 180 registers a change in capacitance whenever the distance between first and second wires 182 and 184 changes as a result of an object touching outer jacket 188 and/or as a result of an electrically conductive object coming into proximity with either of wires 182 or 184.

Figure 34:
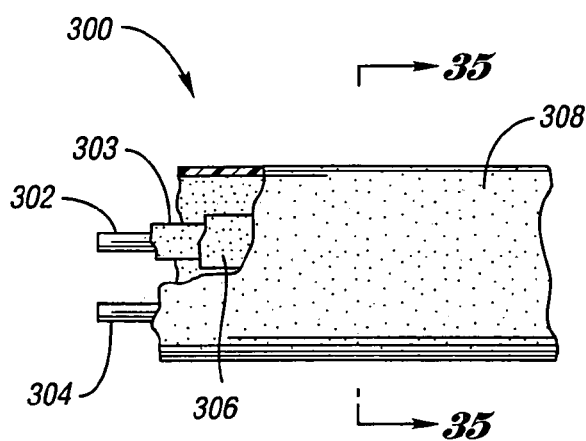
FIG. 34 illustrates a tenth embodiment of the sensor of the anti-entrapment system.
Figure 35:
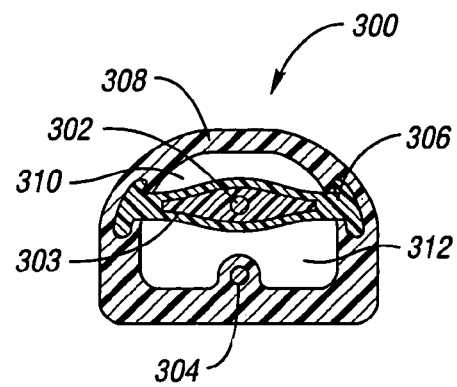
FIG. 35 illustrates a cross-sectional view of the sensor shown in FIG. 34 taken along the line 35—35 of FIG. 34.

Turning to FIGS. 34 and 35, a sensor 300 in accordance with a tenth sensor embodiment is shown. Sensor 300 includes first and second flexible conductive metal wires 302 and 304. A conductive flexible elastomer 303 holds first conductor 302. A non-conductive flexible spanner 306 holds and encases conductive elastomer 303. A conductive elastomeric outer jacket 308 having a hollow interior holds and encases second conductor 304 and holds each end of spanner 306. Spanner 306 divides the interior of outer jacket 308 into two spaces 310 and 312. Spaces 310 and 312 are filled with air or other dielectric medium. Sensor 300 registers a change in capacitance whenever the distance between first and second conductors 302 and 304 changes as a result of an object touching outer jacket 308 and/or as a result of an electrically conductive object coming into proximity with either of conductors 302 or 304.

Referring now to FIGS. 26 and 27, a sensor 200 in accordance with a seventh sensor embodiment is shown. Sensor 200 includes a flexible conductor element 202 encased by a compressible non-conductive elastomer 204. Elastomer 204 rests on a metal frame 206 such as a vehicle frame. Metal frame 206 essentially acts as a second conductor element. As such, sensor 200 registers a change in capacitance whenever the distance between conductor element 202 and metal frame 206 changes as a result of an object touching elastomer 204 and/or as a result of an electrically conductive object coming into proximity with conductor element 202.

Referring now to FIGS. 28 and 29, a sensor 220 in accordance with an eighth sensor embodiment is shown. Sensor 220 includes a continuous non-ending flexible metal braid conductor element 222. Conductor element 222 defines an interior 224 which is filled with air or other dielectric medium. A compressible non-conductive elastomer 226 encases conductor element 222 and its interior 224. Elastomer 226 rests on a metal frame 228 which acts as a second conductor element. Sensor 220 registers a change in capacitance whenever the distance between at least a portion of conductor element 222 and metal frame 228 changes as a result of an object touching elastomer 226 and/or as a result of an electrically conductive object coming into proximity with conductor element 222.

Referring now to FIGS. 30 and 31, a sensor 240 in accordance with a ninth sensor embodiment is shown. Sensor 240 includes inner and outer flexible metal braided conductor elements 242 and 244. Inner conductor element 242 surrounds a first non-conductive compressible foam element 246. Outer conductor element 244 surrounds a second non-conductive compressible foam element 248. A semi-rigid elastomeric outer jacket 250 surrounds second conductor element 244. As best shown in FIG. 31, inner and outer conductor elements 242 and 244 are continuous non-ending elements. Inner conductor element 242 is shaped in a given endless configuration to enable omni-directional proximity sensing capability. As inner conductor element 242 is flexible, its shape may be conformed to provide the desired omni-directional proximity sensing.

Figure 32:
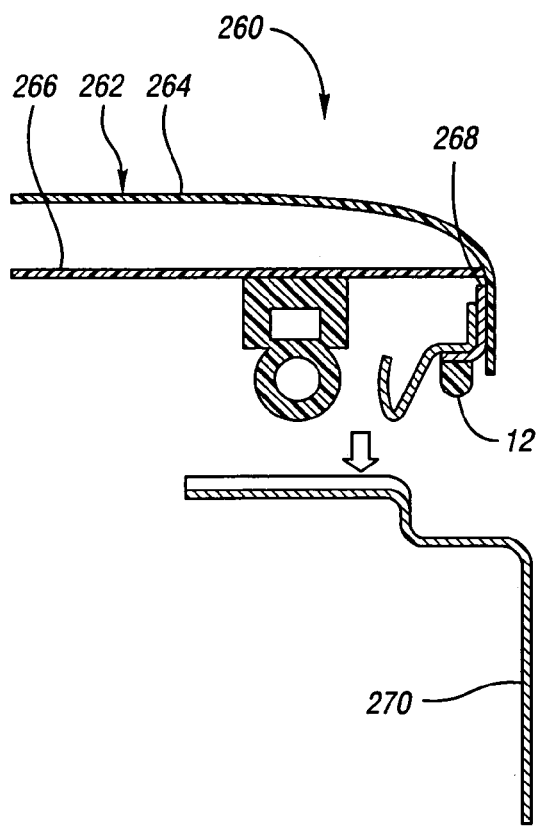
FIG. 32 illustrates a cross-sectional view of the placement of the sensor of the anti-entrapment system for use with a tonneau cover environment.
Figure 33:
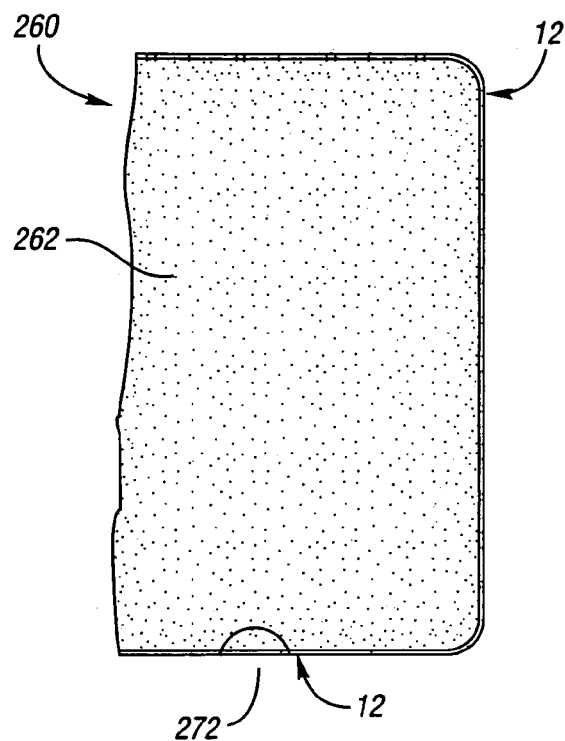
FIG. 33 illustrates a top view of the placement of the sensor of the anti-entrapment system for use with the tonneau cover environment.

Referring now to FIGS. 32 and 33, the placement of sensor 12 of anti-entrapment system 10 for use in a tonneau cover environment 260 is shown. Tonneau cover environment 260 includes an electrically operated tonneau cover 262. Tonneau cover 262 includes an outer tonneau cover 264 and an inner tonneau cover 266. Tonneau cover 262 includes a sensor carrier 268 for holding sensor 12. As shown in FIG. 33, sensor carrier 268 holds sensor 12 along a majority of the periphery of tonneau cover 262 up to the location of a duckbill 272. Tonneau cover 262 opens and closes with respect to a bed wall 270. In a manner as described above, sensor 12 detects the presence of an object adjacent to tonneau cover 262 as a result of such object being adjacent to the sensor and/or touching the sensor. Sensor 12 provides appropriate sensor signals to controller 14 in order to tonneau cover 262 from pinching the object as the tonneau cover closes.

Figure 36:
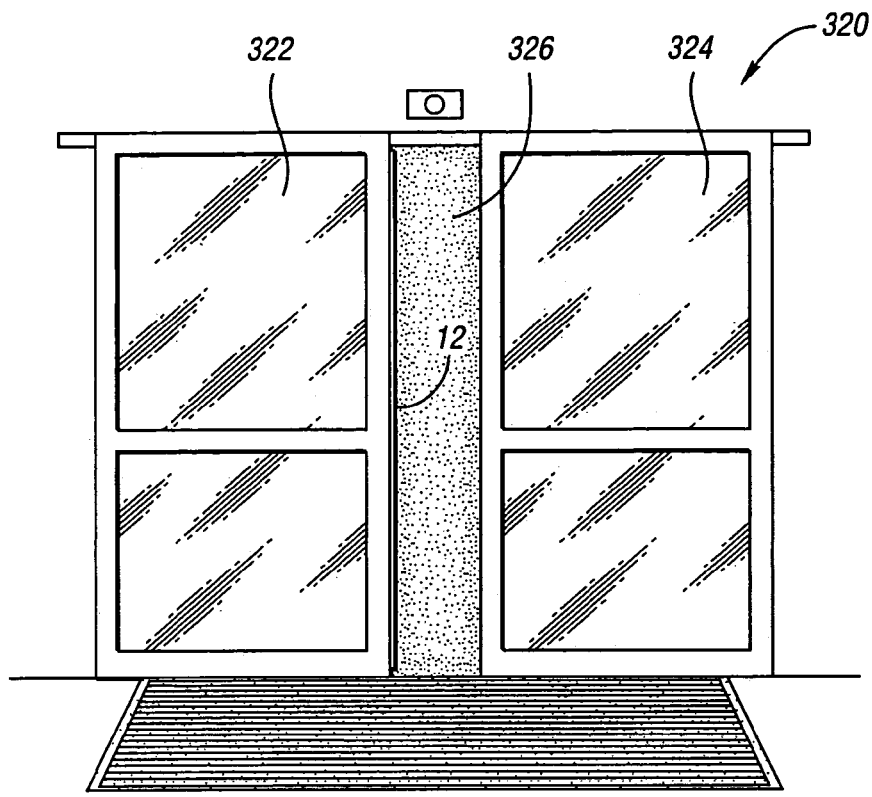
FIG. 36 illustrates the placement of the sensor of the anti-entrapment system for use with a double sliding door environment.
Figure 37:
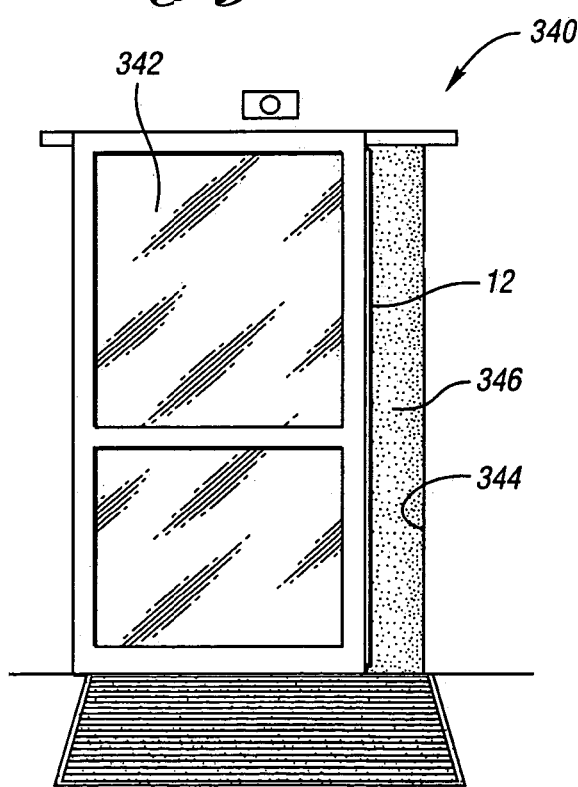
FIG. 37 illustrates the placement of the sensor of the anti-entrapment system for use with a single sliding door environment.

Referring now to FIGS. 36 and 37, the placements of sensor 12 of anti-entrapment system 10 for use in double and single sliding door environments 320 and 340 are respectively shown. Double and single sliding door environments 320 and 340 are typically located in grocery stores and the like. In double sliding door environment 320, sensor 12 is placed on a leading edge of either sliding door 322 or 324. Sliding doors 322 and 324 are shown partially opened with a sliding door opening 326 therebetween. Sensor 12 detects the presence of an object extending between sliding doors 322 and 324 as a result of such object being adjacent to the sensor and/or touching the sensor. Sensor 12 generates an appropriate sensor signal for controller 14 in order to prevent sliding doors 322 and 324 from pinching the object as the doors slide close.

Single sliding door environment 340 includes a sliding door 342 and a door body panel 344. Sliding door 342 moves horizontally to open and close with respect to door body panel 344. In an opened position, sliding door 342 forms a door opening 346 between a leading edge 347 of the sliding door and door body panel 344. Sensor 12 is placed along door body panel 344 in a manner analogous to the placement of the sensor as shown in either FIG. 6A or FIG. 6B. Sensor 12 may also be mounted on sliding door 342 (as shown in FIG. 37) instead of door body panel 344. Sensor 12 detects the presence of an object extending through sliding door opening 346 that is adjacent to the sensor and/or is touching the sensor. In response to sensor 12 detecting an object extending through door opening 346, controller 14 prevents sliding door 342 from pinching the object as the sliding door moves in the direction of the illustrated arrow and closes off door opening 346.

Figure 38:
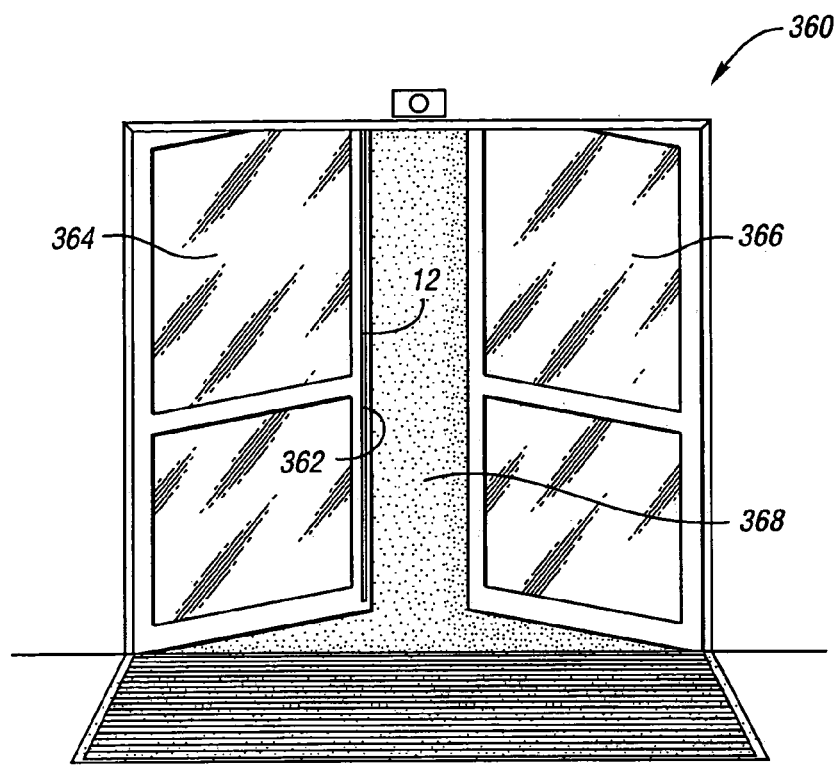
FIG. 38 illustrates the placement of the sensor of the anti-entrapment system for use in a double hinged automatic door environment.
Figure 39:
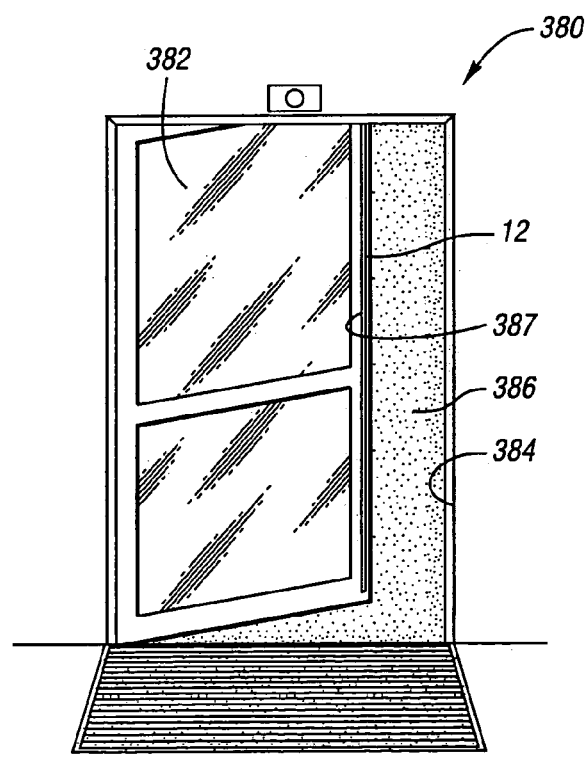
FIG. 39 illustrates the placement of the sensor of the anti-entrapment system for use in a single hinged automatic door environment.

Referring now to FIGS. 38 and 39, the placements of sensor 12 of anti-entrapment system 10 for use in double and single hinged automatic door environments 360 and 380 are respectively shown. Double and single hinged automatic door environments 360 and 380 are typically located in grocery stores and the like. In double hinged automatic door environment 360, sensor 12 is affixed to a sealing surface 362 of either hinged automatic door 364 or 366. Hinged doors 364 and 366 are shown partially opened with a sliding door opening 368 therebetween. Sensor 12 detects the presence of an object extending between hinged doors 364 and 366 as a result of such object being adjacent to the sensor and/or touching the sensor. Sensor 12 generates an appropriate sensor signal for controller 14 in order to prevent hinged automatic doors 364 and 366 from pinching the object as the doors swing to a closed position.

In single hinged automatic door environment 380, sensor 12 is affixed to a sealing surface of a hinged automatic door 382 which closes with respect to a surface of a wall 384. In an opened position, door 382 forms a door opening 386 between a leading edge 387 of the door and wall surface 384. Sensor 12 is placed along wall surface 384 or on leading edge 387 of door 382. Sensor 12 detects the presence of an object extending through door opening 386 that is adjacent to the sensor and/or is touching the sensor in order to enable controller 14 to prevent door 382 from pinching the object as the door swings shut.

Figure 40:
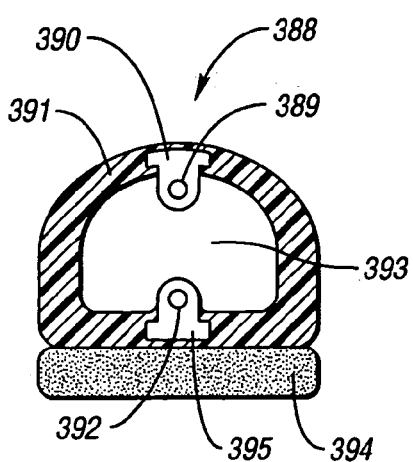
FIG. 40 illustrates a cross-sectional view of an eleventh embodiment of the sensor of the anti-entrapment system taken along the line 40—40 of FIG. 41.
Figure 41:
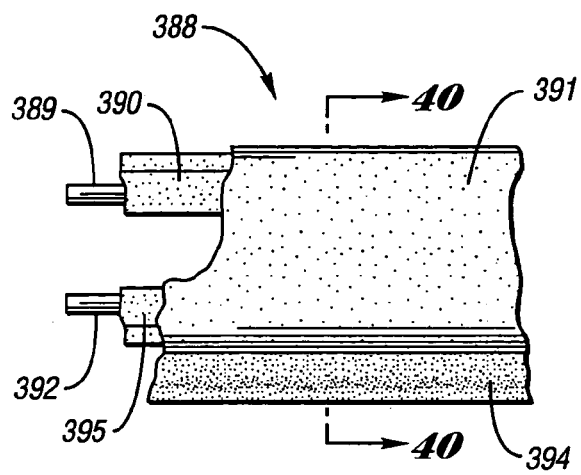
FIG. 41 illustrates a profile view of the sensor shown in FIG. 40.

Referring now to FIGS. 40 and 41, a sensor 388 in accordance with an eleventh sensor embodiment is shown. In general, sensor 388 is a contact type sensor with external over travel capability to prevent high forces. When pressure is applied to a non-conductive elastomer outer jacket 391, a first conductive wire 389, sheathed inside a first conductive elastomer carrier 390, moves toward a second conductive wire 392, sheathed inside a second conductive elastomer carrier 395. A portion of elastomer outer jacket 391 is positioned on an elastomer material 394.

To achieve low force requirements and allow switch movement with electrical contact, an air space 393 is positioned between sheathed first and second conductive wires 389 and 392. After sheathed conductive wires 389 and 392 make contact signaling an obstruction to controller 14, elastomer material 394 is allowed to compress, thus providing an over-travel feature to prevent system inertia from the closure apparatus causing high forces against an obstruction. To this end, elastomer material 394 is a foam or any elastomer material formulated with a slightly higher compression force compared to the compression force to change air space 393 between sheathed conductive wires 389 and 392.

Figure 42:
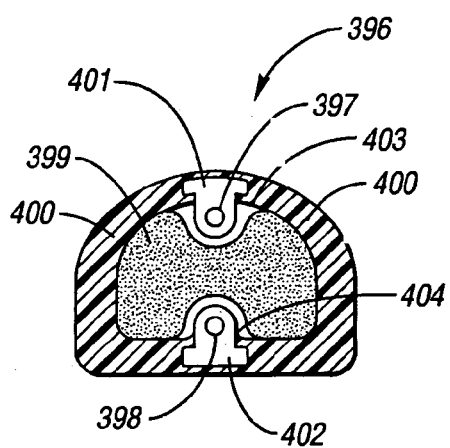
FIG. 42 illustrates a cross-sectional view of a $12^{th}$ embodiment of the sensor of the anti-entrapment system taken along the line 42—42 of FIG. 43.
Figure 43:
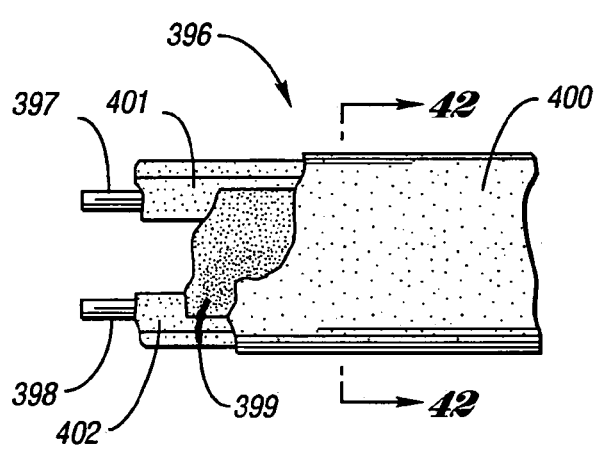
FIG. 43 illustrates a profile view of the sensor shown in FIG. 42.

Referring now to FIGS. 42 and 43, a sensor 396 in accordance with a 12$^{th}$ sensor embodiment is shown. In general, sensor 396 is a contact type sensor with internal over travel capability to prevent high forces. When pressure is applied to a non-conductive elastomer outer jacket 400, a first conductive wire 397, sheathed inside a first conductive elastomer carrier 401, begins to move toward a second conductive wire 398, which is sheathed inside a second conductive elastomer carrier 402. A conductive elastomer material 399 is positioned between sheathed conductive wires 397 and 398. Conductive elastomer material 399 can be foam or any elastomer material formulated to allow for low force. Air spaces 403 and 404 are positioned between sheathed conductive wires 397 and 398 and conductive elastomer material 399.

Air spaces 403 and 404 change as pressure is applied to or removed from non-conductive elastomer outer jacket 400. When pressure applied to non-conductive elastomer outer jacket 400 moves sheathed conductive wires 397 and 398 to completely close air spaces 403 and 404, electrical contact is made with conductive elastomer material 399, thereby completing an electrical circuit and signaling an obstruction to controller 14. After switch contact has been made, conductive elastomer material 399 can continue to compress, thus providing an over-travel feature to prevent system inertia from the closure apparatus causing high forces against an obstruction.

Figure 44:
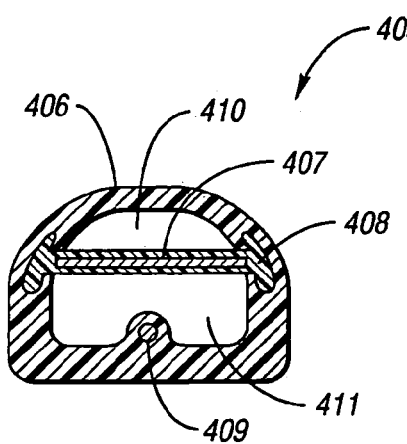
FIG. 44 illustrates a cross-sectional view of a $13^{th}$ embodiment of the sensor of the anti-entrapment system taken along the line 44—44 of FIG. 45.
Figure 45:
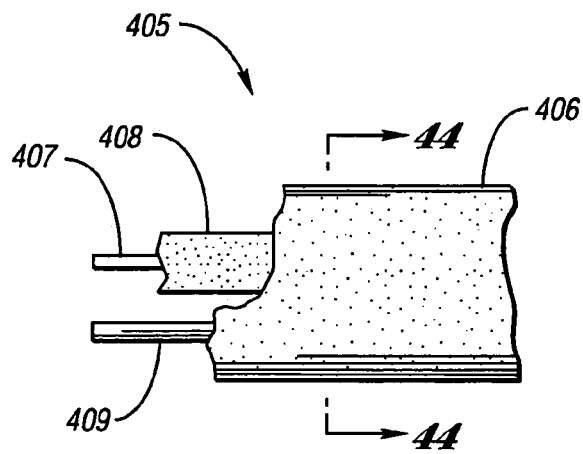
FIG. 45 illustrates a profile view of the sensor shown in FIG. 44.

Referring now to FIGS. 44 and 45, a sensor 405 in accordance with a 13$^{th}$ sensor embodiment is shown. In general, sensor 405 is a combination proximity/displacement sensor with an internal fabric conductive element that can also be used as a heating element and temperature sensor. When pressure is applied to a conductive elastomer outer jacket 406, spaces 410 and 411 compress to move the conductive elastomer outer jacket toward a conductive fabric 407 which is sheathed inside a non-conductive elastomer carrier 408. To this end, spaces 410 and 411 can be air, foam, or any dielectric material formulated to allow for low force.

A conductive wire 409 is used to make an electrical connection for conductive elastomer outer jacket 406. Sensor 405 registers a change in capacitance whenever the distance between conductive fabric 407 and conductive elastomer outer jacket 406 changes as a result of an object touching the outer jacket and/or as a result of an electrically conductive object coming into proximity with the outer jacket. The change in capacitance is signaled to controller 14.

Conductive fabric 407 may be used as a heating element when the anti-pinch strip system is inactive. The heating element function can be used to heat sensor 405, which may be being used as a weather seal, keeping conductive elastomer carrier 408 and dielectric spaces 410 and 411 pliable in cold weather conditions. It is a goal to have the weather seal properties maintained to application compliance standards while heated. Additionally, the heated weather seal could be used to prevent the window or sliding panel from freezing and/or to aid in thawing a frozen window or sliding panel while in the closed position. Conductive fabric 407 would be engaged as a heating element when powered by relays turned on by controller 14 with inputs from a temperature sensor, which could be from the vehicle outside temperature sensor. The temperature input could also originate from a separate temperature sensor located on a device inside the vehicle door, or anywhere else outside the vehicle.

The temperature setting to turn on conductive fabric 407 heating element is optional, but would likely be set for temperatures at or below 40° F. where cold weather pliability is required. When the set temperature is reached, controller 14 will turn conductive fabric 407 heater element on to make the weather seal pliable. The circuit in controller 14 can also be configured to automatically cycle conductive fabric 407 heater element on and off after the desired pliability is achieved to thereafter maintain pliability.

By using relays or transistors the heater element 407 can be powered such that an appropriate amount of current flows through the element. The current flow through the resistive element will produce the required amount of heat following the well known equation Power (Watts)=$I^2 \times R$. The power can be applied for a given amount of time and then removed. During the time power is removed, the heating element 407 can be connected to a circuit that provides a small amount of current flow through the element and through a series connected resistor.

Heating element 407 and the series connected resistor form a voltage divider. The voltage that is developed can then be interpreted by a microprocessor, or other device such as an op-amp, to determine the temperature of heating element 407. If the temperature is below a determined set-point, heating element 407 can again be connected such that power is applied to it increasing the amount of heat generated. After the temperature sensor determines that the temperature is above the set point, controller 14 will turn off the relays or transistors providing power to conductive fabric 407 heater element.

Alternatively, controller 14 can be configured to inhibit a user input command to open a window or sliding panel when, anytime during the time of heating conductive fabric 407, no window or panel movement is sensed, indicating a stalled motor condition such as may be caused by ice build up in the weather seal. During such an event, controller 14 continues to inhibit user commands to open the window or sliding panel until conductive fabric 407 heater element inside the weather seal has achieved a temperature sufficient to free the window or sliding panel. Controller 14 could be configured to recognize the above condition from temperature sensor inputs at all times, including when vehicle ignition and/or other vehicle power is off. Implementation of this function could reduce warranty costs related to the window or sliding panel drive mechanism, seals, and motor.

Alternatively, conductive fabric 407 could be used as a heating element inside a weather seal not using an anti-pinch strip system. In this case, controller 14 is configured to only control the heating element function as described above. The controlling function could also be integrated as part of other electronics being employed within the application system.

Alternatively, conductive fabric 407 could be used as a temperature sensor, either as a stand-alone sensor, or in combination with the anti-pinch system. The function to switch between temperature sensing and anti-pinch sensing would be configured through controller 14. The temperature sensing function of conductive fabric 407 could be used to provide the same temperature inputs required to operate the anti-pinch system as described above.

Referring now to FIGS. 46 and 47, a sensor 412 in accordance with a 14$^{th}$ sensor embodiment is shown. In general, sensor 412 is a combination proximity displacement sensor with conductive fabric attached to an outside profile. The conductive fabric can be used as a heating element and temperature sensor. When pressure is applied to a non-conductive elastomer outer jacket 413, a space 417, compresses to move a first conductive fabric 414, attached externally to non-conductive outer jacket 413 and covered with flexible non-conductive flocking material 415, towards a second conductive fabric 416. To this end, space 417 is air, foam, or any dielectric material formulated to allow for low force.

Sensor 412 registers a change in capacitance whenever the distance between first conductive fabric 414 and second conductive fabric 416 changes as a result of an object touching non-conductive flocking material covering 415 and/or as a result of an electrically conductive object coming into proximity with first conductive fabric 414. The change in capacitance is signaled to controller 14.

Conductive fabric 414 may be used as a heating element when the anti-pinch strip system is inactive. The heating element function can be used to heat sensor 412, which may be being used as a weather seal, keeping elastomer outer jacket 413, non-conductive flocking material 415, and dielectric space 417 pliable in cold weather conditions. It is a goal to have the weather seal properties maintained to application compliance standards while heated. Additionally, the heated weather seal could be used to prevent the window or sliding panel from freezing and/or to aid in thawing a frozen window or sliding panel while in the closed position. Conductive fabric 414 would be engaged as a heating element when powered by relays turned on by controller 14 with inputs from a temperature sensor, which could be from the vehicle outside temperature sensor. The temperature input could also originate from a separate temperature sensor located on a device inside the vehicle door, or anywhere else outside the vehicle.

The temperature setting to turn on conductive fabric 414 heating element is optional, but would likely be set for temperatures at or below 40° F. where cold weather pliability is required. When the set temperature is reached, controller 14 turns conductive fabric 414 heater element on to make the weather seal pliable. The circuit in controller 14 can also be configured to automatically cycle the conductive fabric 414 heater element on and off after the desired pliability is achieved to thereafter maintain pliability. By using relays or transistors the heater element can be powered such that an appropriate amount of current flows through the element. The current flow through the resistive element will produce the required amount of heat following the well known equation Power (Watts)=$I^2 \times R$. The power can be applied for a given amount of time and then removed. During the time power is removed, the heating element can be connected to a circuit that provides a small amount of current flow through the element and through a series connected resistor.

Heating element 414 and the series connected resistor form a voltage divider. The voltage that is developed can then be interpreted by a microprocessor, or other device such as an op-amp, to determine the temperature of the heating element. If the temperature is below a determined set-point, heating element 414 can again be connected such that power is applied to it increasing the amount of heat generated. After the temperature sensor determines that the temperature is above the set point, controller 14 turns off the relays providing power to conductive fabric 414 heater element.

Alternatively, controller 14 can be configured to inhibit a user input command to open a window or sliding panel when, anytime during the time of heating conductive fabric 414, no window or panel movement is sensed, indicating a stalled motor condition such as may be caused by ice build up in the weather seal. During such an event, controller 14 continues to inhibit user commands to open the window or sliding panel until conductive fabric 414 heater element inside the weather seal has achieved a temperature sufficient to free the window or sliding panel. Controller 14 could be configured to recognize the above condition from temperature sensor inputs at all times, including when vehicle ignition and/or other vehicle power is off. Implementation of this function could reduce warranty costs related to the window or sliding panel drive mechanism, seals, and motor.

Alternatively, conductive fabric 414 could be used as a heating element inside a weather seal not using an anti-pinch strip system. In this case, controller 14 is configured to only control the heating element function as described above. The controlling function could also be integrated as part of other electronics being employed within the application system.

Alternatively, conductive fabric 414 could be used as a temperature sensor, either as a stand alone sensor, or in combination with the anti-pinch system. The function to switch between temperature sensing and anti-pinch sensing would be configured through controller 14. The temperature sensing function of conductive fabric 414 could be used to provide the same temperature inputs required to operate the anti-pinch system as described above.

Referring now to FIGS. 48 and 49, a sensor 418 in accordance with a $15^{th}$ sensor embodiment is shown. In general, sensor 418 is a combination proximity/displacement sensor with conductive fabric attached to an inside profile. The conductive fabric can be used as a heating element and temperature sensor. When pressure is applied to a non-conductive elastomer outer jacket 419, which can be covered with flexible non-conductive flocking material 421, space 423, compresses to move a first conductive fabric 420, attached internally to anon-conductive outer jacket 413, towards a second conductive fabric 422. To this end, space 423 can be air, foam, or any dielectric material formulated to allow for low force.

Sensor 418 registers a change in capacitance whenever the distance between first conductive fabric 420 and second conductive fabric 422 changes as a result of an object touching non-conductive flocking material covering 421 and/or as a result of an electrically conductive object coming into proximity with first conductive fabric 420. The change in capacitance is signaled to controller 14.

Conductive fabric 420 may be used as a heating element when the anti-pinch strip system is inactive. The heating element function can be used to heat sensor 418, which may be being used as a weather seal, keeping elastomer outer jacket 419, non-conductive flocking material 421, and dielectric space 423 pliable in cold weather conditions. It is a goal to have the weather seal properties maintained to application compliance standards while heated. Additionally, the heated weather seal could be used to prevent the window or sliding panel from freezing and/or to aid in thawing a frozen window or sliding panel while in the closed position. Conductive fabric 420 would be engaged as a heating element when powered by relays turned on by controller 14 with inputs from a temperature sensor, which could be from the vehicle outside temperature sensor. The temperature input could also originate from a separate temperature sensor located on a device inside the vehicle door, or anywhere else outside the vehicle.

The temperature setting to turn on the conductive fabric 420 heating element is optional, but would likely be set for temperatures at or below 40° F. where cold weather pliability is required. When the set temperature is reached, controller 14 turns conductive fabric 420 heater element on to make the weather seal pliable. The circuit in controller 14 can also be configured to automatically cycle the conductive fabric 420 heater element on and off after the desired pliability is achieved to thereafter maintain pliability. By using relays or transistors the heater element can be powered such that an appropriate amount of current flows through the element. The current flow through the resistive element will produce the required amount of heat following the well known equation Power (Watts)=$I^2 \times R$. The power can be applied for a given amount of time and then removed. During the time power is removed, the heating element can be connected to a circuit that provides a small amount of current flow through the element and through a series connected resistor.

The heating element 420 and the series connected resistor form a voltage divider. The voltage that is developed can then be interpreted by a microprocessor, or other device such as an op-amp, to determine the temperature of the heating element. If the temperature is below a determined set-point, heating element 420 can again be connected such that power is applied to it increasing the amount of heat generated. After the temperature sensor determines that the temperature is above the set point, controller 14 turns off the relays providing power to conductive fabric 420 heater element.

Alternatively, controller 14 can be configured to inhibit a user input command to open a window or sliding panel when, anytime during the time of heating conductive fabric 420, no window or panel movement is sensed, indicating a stalled motor condition such as may be caused by ice build up in the weather seal. During such an event, controller 14 continues to inhibit user commands to open the window or sliding panel until conductive fabric 420 heater element inside the weather seal has achieved a temperature sufficient to free the window or sliding panel. Controller 14 could be configured to recognize the above condition from temperature sensor inputs at all times, including when vehicle ignition and/or other vehicle power is off. Implementation of this function could reduce warranty costs related to the window or sliding panel drive mechanism, seals, and motor.

Alternatively, conductive fabric 420 could be used as a heating element inside a weather seal not using an anti-pinch strip system. In this case, controller 14 is configured to only control the heating element function as described above. The controlling function could also be integrated as part of other electronics being employed within the application system.

Alternatively, conductive fabric 420 could be used as a temperature sensor, either as a stand alone sensor, or in combination with the anti-pinch system. The function to switch between temperature sensing and anti-pinch sensing would be configured through controller 14. The temperature sensing function of conductive fabric 420 could be used to provide the same temperature inputs required to operate the anti-pinch system as described above.

Referring now to FIGS. 50 and 51, a sensor 424 in accordance with a 16$^{th}$ sensor embodiment is shown. In general, sensor 424 includes a conductive fabric attached to an outside profile for use as heating element and temperature sensor. Sensor 424 further uses a conductive fabric inside the profile for use as a proximity/displacement sensor. When pressure is applied to a non-conductive elastomer outer jacket 425, space 430, compresses to move a first conductive fabric 426, attached internally to a non-conductive outer jacket 425, towards a second conductive fabric 427. To this end, space 430 is an air, foam, or any dielectric material formulated to allow for low force.

Sensor 424 registers a change in capacitance whenever the distance between first conductive fabric 426 and second conductive fabric 427 changes as a result of an object touching non-conductive flocking material covering 429 and/or as a result of an electrically conductive object coming into proximity with first conductive fabric 426. The change in capacitance is signaled to controller 14. A conductive fabric 428, attached externally to a non-conductive elastomer outer jacket 425 and covered with a flexible non-conductive flocking material 429, is used a heating element.

The heating element function can be used to heat sensor 424, which may be being used as a weather seal, keeping elastomer outer jacket 425, non-conductive flocking material 429, and dielectric space 430 pliable in cold weather conditions. It is a goal to have the weather seal properties maintained to application compliance standards while heated. Additionally, the heated weather seal could be used to prevent the window or sliding panel from freezing and/or to aid in thawing a frozen window or sliding panel while in the closed position. Conductive fabric 428 heating element would be powered by relays turned on by controller 14, either manually or with inputs from a temperature sensor, which could be from the vehicle outside temperature sensor. The temperature input could also originate from a separate temperature sensor located on a device inside the vehicle door, or anywhere else outside the vehicle. The temperature setting to turn on conductive fabric 428 heating element is optional, but would likely be set for temperatures at or below 40° F. where cold weather pliability is required.

When the set temperature is reached, controller 14 turns conductive fabric 428 heater element on to make the weather seal pliable. The circuit in controller 14 can also be configured to automatically cycle conductive fabric 428 heater element on and off after the desired pliability is achieved to thereafter maintain pliability. By using relays or transistors the heater element can be powered such that an appropriate amount of current flows through the element. The current flow through the resistive element 428 produces the required amount of heat following the well known equation Power (Watts)=$I^2 \times R$. The power can be applied for a given amount of time and then removed. During the time power is removed, the heating element can be connected to a circuit that provides a small amount of current flow through the element and through a series connected resistor.

Heating element 428 and the series connected resistor form a voltage divider. The voltage that is developed can then be interpreted by a microprocessor, or other device such as an op-amp, to determine the temperature of heating element 428. If the temperature is below a determined set-point, heating element 428 can again be connected such that power is applied to it increasing the amount of heat generated. After the temperature sensor determines that the temperature is above the set point, controller 14 turns off the relays providing power to conductive fabric 428 heater element.

Alternatively, controller 14 can be used to inhibit a user input command to open a window or sliding panel when, anytime during the time of heating conductive fabric 428, no window or panel movement is sensed, indicating a stalled motor condition such as may be caused by ice build up in the weather seal. During such an event, controller 14 continues to inhibit user commands to open the window or sliding panel until conductive fabric 428 heater element inside the weather seal has achieved a temperature sufficient to free the window or sliding panel. Controller 14 could be configured to recognize the above condition from temperature sensor inputs at all times, including when vehicle ignition and/or other vehicle power is off. Implementation of this function could reduce warranty costs related to the window or sliding panel drive mechanism, seals, and motor.

Alternatively, conductive fabric 428 can be used as a heating element on a weather seal not using an anti-pinch strip system. In this case, controller 14 is configured to only control the heating element function as described above. The controlling function could also be integrated as part of other electronics being employed within the application system.

Alternatively, conductive fabric 428 could be used as a temperature sensor, either as a stand alone sensor, or in combination with the heating element function. The function to switch between temperature sensing and heating would be configured through controller 14. The temperature sensing function of conductive fabric 428 could be used to provide the same temperature inputs required to operate the anti-pinch system as described above.

Referring now to FIGS. 52 and 53, a sensor 431 in accordance with a 17$^{th}$ sensor embodiment is shown. In the preferred embodiment, an anti-pinch sensor strip, which could be in the form of a weather seal, is affixed to a non-moving member. In the preferred embodiment, a window or sliding panel moves toward or away from the fixed anti-pinch sensor strip. In FIGS. 52 and 53, sensor 431 is configured to be part of the window or sliding panel. In general, sensor 431 is a proximity sensor with conductive elements located on a rigid moving member. The conductive elements can also be used as heating elements.

Sensor 431 registers a change in capacitance as a result of an electrically conductive object coming into proximity with leading edge of window or sliding panel 432. The change in capacitance is signaled to controller 14. As shown in FIG. 53, a first conductive strip 433 and a second conductive strip 434, which could be composed of indium tin oxide, copper or other conductive materials, are deposited to either side of window or sliding panel 432 in close proximity to the leading edge. Conductive strips 433 and 434 continuously follow the leading edge of window or sliding panel 432 wherever pinching may occur during closure. Electrical connection between conductive strips 433 and 434 and controller 14 could be made by wire cable interface, or RF signal. In an RF configuration, battery powered electronics attached to the window or sliding panel could provide the necessary sensor information for obstruction detection and motor control.

In the case of controller 14 receiving sensor signals responsive to motor 18 or other moving members, the controller would have additional anti-entrapment capabilities by making use of motor current and/or commutator pulses and/or sensor signals from Hall (or other type) sensors. This would have the added benefit of being able to detect obstructions while the moving member and the obstruction are too far away from sensor 431 to be sensed by sensor 431, or the obstruction is a non electrically conducting member.

Alternatively, conductive strips 433 and 434 can be used as a heating element when the anti-pinch strip system is inactive. It is a to use the heated portion of the window or sliding panel to aid in keeping the weather seal properties maintained to application compliance standards while heated. Additionally, the heated leading edge of window or sliding panel 432 could be used to prevent freezing and/or to aid in thawing a frozen window or sliding panel while in the closed position. Conductive strips 433 and 434 would be engaged as a heating element when powered by relays turned on by electronic controller 14 with inputs from a temperature sensor, which could be from the vehicle outside temperature sensor. The temperature input could also originate from a separate temperature sensor located on a device inside the vehicle door, or anywhere else outside the vehicle. The temperature setting to turn on conductive strips 433 and 434 as a heating element is optional, but would likely be set for temperatures at or below 40° F. where cold weather pliability is required.

When the set temperature is reached, controller 14 turns conductive strips 433 and 434 as a heater element on to make the weather seal pliable. The circuit in controller 14 can also be configured to automatically cycle conductive strips 433 and 434 as a heater element on and off after the desired pliability of the mating weather seal is achieved to thereafter maintain pliability. By using relays or transistors the heater element can be powered such that an appropriate amount of current flows through the element. The current flow through the resistive element will produce the required amount of heat following the well known equation Power (Watts)=$I^2 \times R$. The power can be applied for a given amount of time and then removed. During the time power is removed, heating element 433 and 434 can be connected to a circuit that provides a small amount of current flow through the element and through a series connected resistor.

Heating element 433 and 434 and the series connected resistor form a voltage divider. The voltage that is developed can then be interpreted by a microprocessor, or other device such as an op-amp, to determine the temperature of the heating element. If the temperature is below a determined set-point, the heating element can again be connected such that power is applied to it increasing the amount of heat generated. After the temperature sensor determines that the temperature is above the set point, controller 14 turns off the relays providing power to conductive strips 433 and 434 heater element. For efficiency, controller 14 could also be configured to inhibit the heater element function when the window or sliding panel is not in the closed position.

Alternatively, controller 14 can be used to inhibit a user input command to open a window or sliding panel when, anytime during the time of heating conductive strips 433 and 434, no window or panel movement is sensed, indicating a stalled motor condition such as may be caused by ice build up in the weather seal. During such an event, controller 14 continues to inhibit user commands to open the window or sliding panel until conductive strips 433 and 434 heater element has achieved a temperature sufficient to free the window or sliding panel. Controller 14 could be configured to recognize the above condition from temperature sensor inputs at all times, including when vehicle ignition and/or other vehicle power is off. Implementation of this function could reduce warranty costs related to the window or sliding panel drive mechanism, seals, and motor.

Alternatively, conductive strips 433 and 434 can be used as a heating element on a window or sliding panel not using an anti-pinch strip system. In this case, controller 14 is configured to only control the heating element function as described above. The controlling function could also be integrated as part of other electronics being employed within the application system.

Referring now to FIGS. 54 and 55, cross-sectional views of a sensor 449 and a sensor 470 in accordance with 18$^{th}$ and 19$^{th}$ sensor embodiments are respectively shown. Sensor 449 is configured with a dielectric space 452 which preferably has a thickness of 0.75 mm. Conductor plates (i.e., flat wires) 450 and 451 sandwich dielectric space 452. Dielectric space 452 is filled with a dielectric medium 452a such as a dielectric compressible elastomer. An elastomer outer jacket 457 encases conductor plates 450 and 451 and dielectric medium 452a. Elastomer outer jacket 457 has angled side walls 455. Angled side walls 455 of outer jacket 457 function as a dovetailing feature for attaching sensor 449 to an automotive window weather seal, or other such applications.

Sensor 470 is generally similar to sensor 449 but differs in that dielectric space 452 preferably has a thickness of 1.5 mm and outer jacket 457 has straight side walls. Sensor 470 is attachable by means of adhesive products, or over molding into a weather seal or other end use application.

Conductor plates 450 and 451 of sensors 449 and 470 are respectively equivalent to conductors 22 and 24 of sensor 12 shown in FIG. 2 and are respectively equivalent to first and second flexible conductive metal wires 302 and 304 of sensor 300 shown in FIGS. 34 and 35.

Dielectric space 452 of sensors 449 and 470, which is filled with dielectric medium 452a, maintains a predefined distance between conductor plates 450 and 451. The predefined distance can be changed as required for a particular application. Dielectric medium 452a can have either compressible or non-compressible capabilities. Conductor plates 450 and 451 are similar in function to conductors 302 and 304 of sensor 300 shown in FIGS. 34 and 35 and provide pinch and proximity sensor signals 21 and 23 to controller 14.

The capacitance of sensor 449 (and sensor 470) changes as a result of an object in proximity to the sensor or as a result of physical contact with the sensor which causes conductor plates 450 and 451 to move closer together. As conductor plates 450 and 451 become closer together, the capacitance changes.

Figure 59:
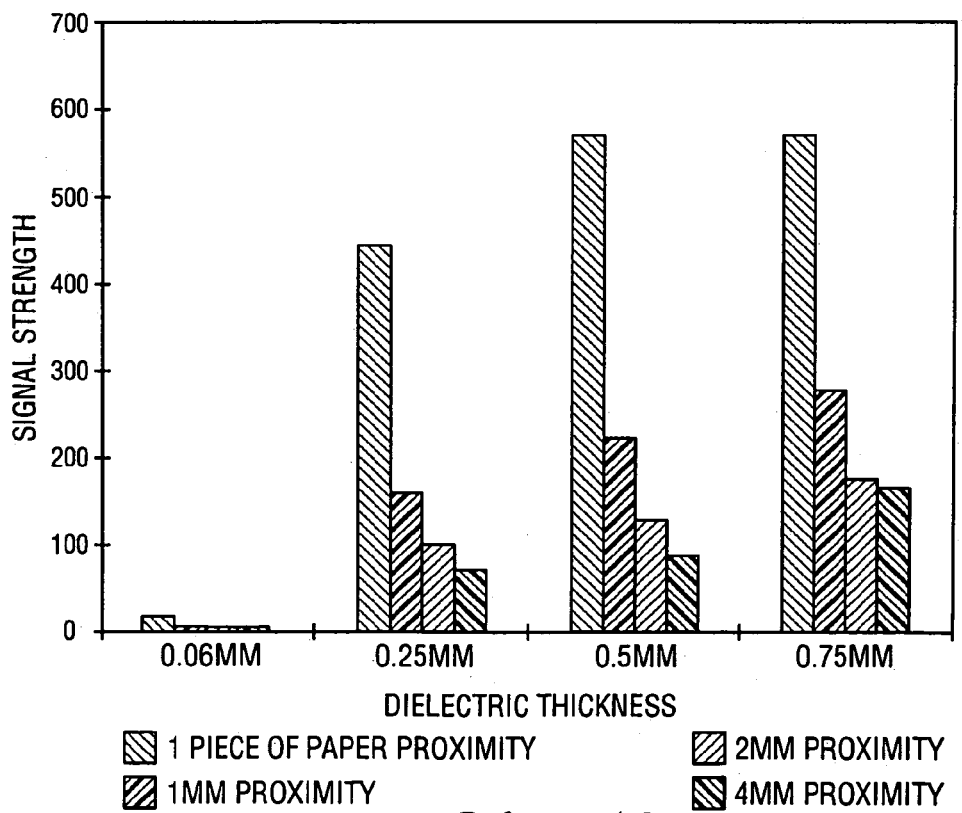
FIG. 59 illustrates a graph showing the relationship of proximity signal strength of a capacitance sensor in accordance with the present invention versus dielectric thickness of different object proximity distance.

As shown in FIG. 59, the signal strength of sensor 449 (and sensor 470) increases as the proximity of an object to the sensor increases (i.e., as the proximity of an object to at least one of the conductor plates 450 and 451 increases). Also, as conductor plates 450 and 451 become longer, dielectric space 452 provided between the conductor plates is optimized to provide the maximum signal. A material thickness of 0.13 mm allows cost effective manufacturing, yet is durable enough to allow repeated flexure of conductor plates 450 and 451 without fatiguing or fracturing.

The preferred material for conductor plates 450 and 451 is spring temper alloy 510 phosphor bronze, but could be any electrically conductive material, such as tempered steel, tin coated to prevent oxidation. Phosphor bronze also has inherent properties making it ideal for solder or other attachment of connector wires.

Sensors 449 and 470 are shown in FIGS. 54 and 55 in the optimal package size to provide both proximity and pinch sensor signals. For sensing an obstruction with either pinch or proximity signals, the optimal width 453 of conductor plates 450 and 451 falls within the range of 6–7 mm and preferably is 6.7 mm.

Figure 56:
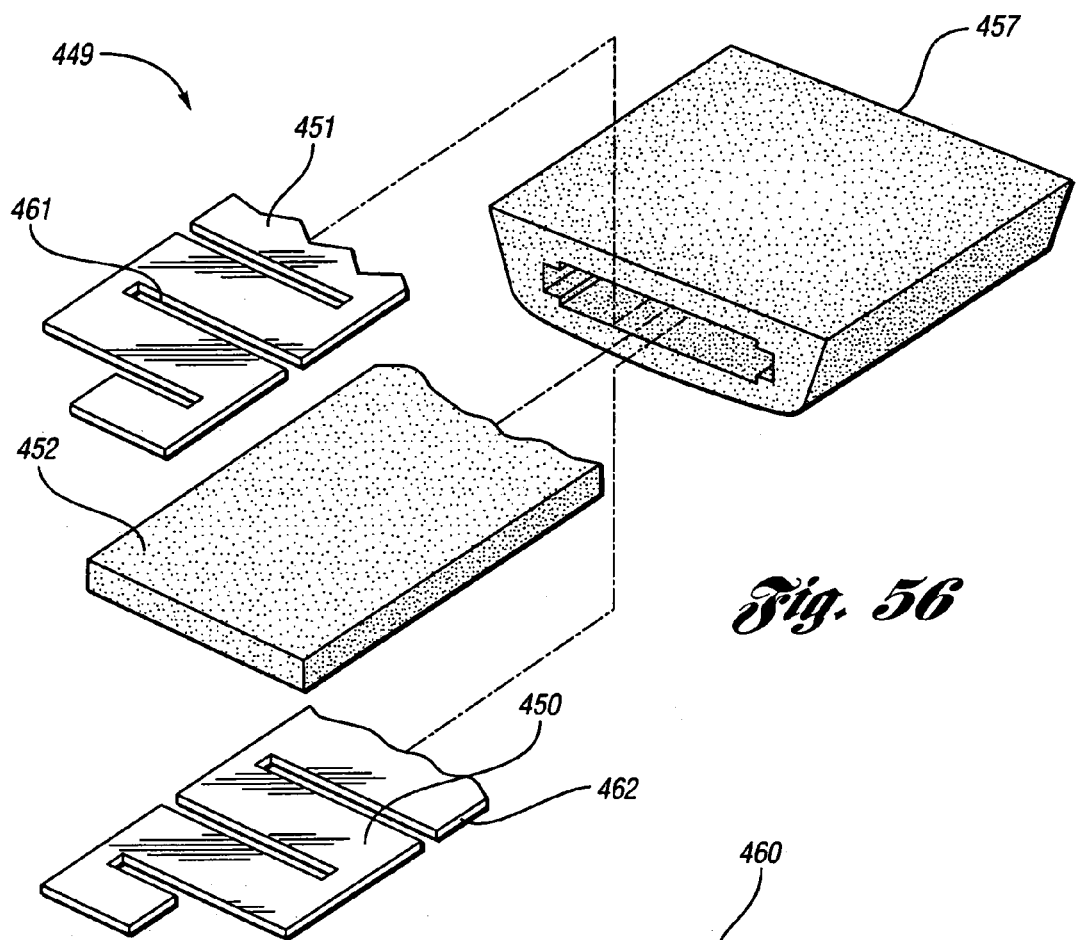
FIG. 56 illustrates a blown-up view of the sensor shown in FIG. 54.

As shown in FIG. 56, conductor plates 450 and 451 of sensor 449 (and sensor 470) are constructed in a serpentine pattern with spaced slots 461. This configuration provides flexibility for conforming sensors 449 and 470 to shapes that would apply a load perpendicularly to the flat planar surface of conductor plates 450 and 451 in certain applications. The spaced slots 461 are preferably 0.5 mm wide and 5 mm in length, spaced 2.5 mm apart along the entire length of conductor plates 450 and 451. Other slot sizes, spacings, and patterns could be used to accomplish the same flexibility purpose specific to a given application of sensors 449 and 470.

Figure 58:
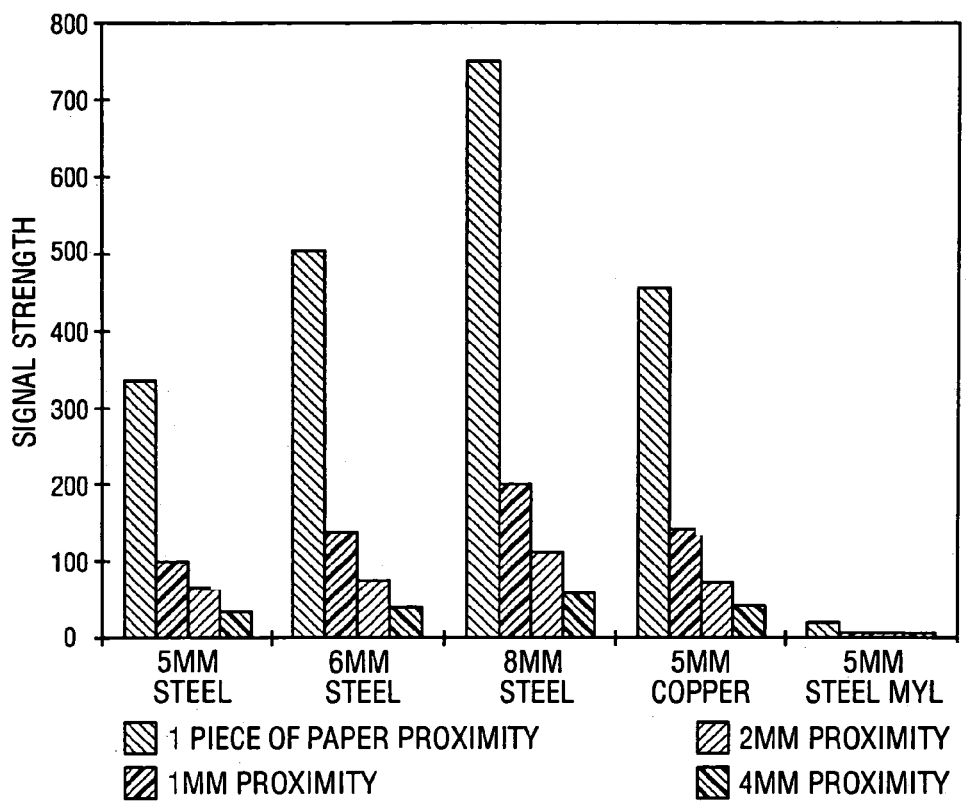
FIG. 58 illustrates a graph showing the relationship of proximity signal strength of a capacitor sensor in accordance with the present invention versus conductor plate width for different object proximity distances and different object material types.

By increasing the widths 453 of conductor plates 450 and 451, a larger overall sensor can be created to allow for a greater surface area of entrapment protection. As shown in FIG. 58, testing has established that as conductor plates 450 and 451 become wider, the capacitance signal strength increases. The signal strength is also affected by the material used for conductor plates 450 and 451 as shown in FIG. 58.

Figure 57:
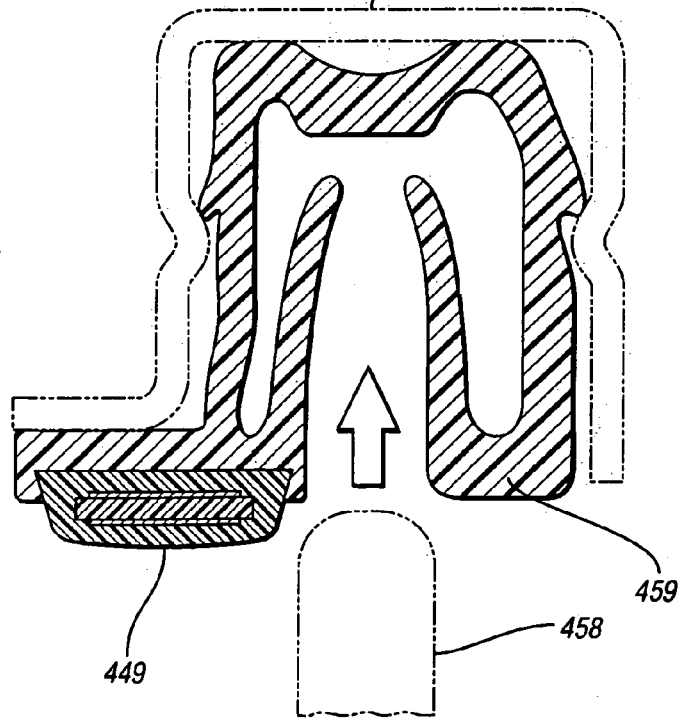
FIG. 57 illustrates a cross-sectional view of the sensor shown in FIG. 54 positioned within the weather seal of a window frame.

Sensors 449 and 470 are sized for a typical automobile door window seal application. As shown in FIG. 57, sensor 449 is attached to a conductive or non-conductive elastomer weather seal 459. Weather seal 459 is attached to an automobile window frame 460. Frame 460 and weather seal 459 have an opening for receiving an automobile window 458 when the window is in a fully closed position.

As such, sensors 449 and 470 have a minimum profile designed to not reduce viewing through the window opening. If a non-compressible material is used, then sensors 449 and 470 provide proximity sensing only operation. If compressible material is used, then sensors 449 and 470 provide both pinch and proximity sensing operations. The preferred material for dielectric medium 452a of sensors 449 and 470 is an electrically non-conductive flexible polyurethane foam, such as Rogers Corporation Poron 4701-30-20062-04. Other foam materials, such as EPDM, thermoplastic rubber, thermoplastic elastomer, or TPV could also be used for dielectric medium 452a. These materials are currently used in window seals to meet the appearance and reliability requirements for window closures. Santoprene, a thermoplastic elastomer material made by Advanced Elastomer Systems, maintains stable compression characteristics over temperature, whereas EPDM compression characteristics decrease as temperature is reduced.

Stiff compression characteristics increase pinch forces. A material, which maintains flexibility and compression characteristics when cold, is preferred for pinch operation of sensors 449 and 470. The material for dielectric medium 452a could be introduced by co-extrusion as any of the materials mentioned, or made by forming the outer jacket 457 material in dielectric space 452 between conductor plates 450 and 451. A foamed space would be made up of the material of outer jacket 457 and air as the dielectric.

The preferred material of outer jacket 457 is a non-electrically conductive thermoplastic rubber or elastomer material, such as Santoprene. The surface resistivity of outer jacket 457 and dielectric medium 452a is greater than $10^6$ ohm/cm to avoid electrical shorting potential between conductor plates 450 and 451 and conductive elastomer wheather seal 459. The thickness 454 of the material of outer jacket 457 between conductor plate 450 and the sensing surface of the outer jacket contains the optimal amount of outer jacket material required to (a) completely enclose conductor plates 450 and 451 and dielectric medium 452a (i.e., completely enclose sensors 449 and 470) with outer jacket 457 to prevent moisture infiltration; (b) reduce the possibility of voids; and (c) keep the dimension of the proximity of the human object to the conductor plates 450 and 451 at an optimum spacing to provide the maximum sensitivity.

As previously described, in the test results shown in FIG. 58, as outer jacket thickness 454 increases, the proximity detection capability of controller 14 is reduced. As width 453 of conductor plates 450 and 451 increases, the discrimination ability of sensors 449 and 470 improves as less amplification of the signal is required. This provides more stability and greater sensing distances between object 16 and sensors 449 and 470.

While the present invention has been described in conjunction with specific embodiments thereof, it is evident that many alternatives, modifications, and variations will be apparent to those skilled in the, art in light of the foregoing description. Accordingly, it is intended to embrace all such alternatives.

What is claimed is:

1. An anti-entrapment system for preventing an object from being entrapped by a translating device, the system comprising:
   a capacitance sensor positioned adjacent to a translating device, the capacitance sensor having first and second electrical conductors separated by a separation distance, a compressible dielectric element interposed between the conductors, and an electrically non-conductive elastomer outer jacket encasing the conductors and the dielectric element, the capacitance sensor having a capacitance dependent upon the separation distance between the conductors;
   wherein the capacitance changes in response to the separation distance between the conductors decreasing as a result of the dielectric element compressing in response to a first object touching the outer jacket;
   wherein the capacitance changes in response to a second electrically conductive object coming into proximity with at least one of the conductors; and
   a controller for controlling the translating device as a function of the capacitance in order to prevent the translating device from entrapping either object.

2. The system of claim 1 wherein:
   the translating device is an automobile window, wherein a portion of the outer jacket is attached to a window weather seal in order to position the capacitance sensor adjacent to an automobile window frame.

3. The system of claim 2 wherein:
   the outer jacket has angled side walls for attaching the portion of the outer jacket to the window weather seal.

4. The system of claim 2 wherein:
   the outer jacket has straight side walls for attaching the portion of the outer jacket to the window weather seal.

5. The system of claim 1 wherein:
   the conductors are conductor plates.

6. The system of claim 5 wherein:
   each conductor plate has spaced apart slots arranged in a serpentine pattern.

7. The system of claim 1 wherein:
   the dielectric element is a dielectric elastomer.

8. The system of claim 1 wherein:
   the outer jacket is semi-rigid.

9. The system of claim 1 wherein:
   the dielectric element is a semi-rigid dielectric elastomer.

10. The system of claim 1 wherein:
    the dielectric element is air.

11. The system of claim 1 wherein:
    the capacitance sensor is formed integral with a weather strip which receives the translating device when the translating device is in a fully closed position.

12. The system of claim 1 wherein:
    the translating device is an automobile sliding-door.

13. The system of claim 12 wherein:
    the capacitance sensor is positioned on an automobile sliding-door body panel which receives the automobile sliding-door when the automobile sliding-door is in a fully closed position.

14. The system of claim 1 wherein:
    the translating device is an automobile sunroof.

15. The system of claim 14 wherein:
    the capacitance sensor is positioned on an automobile roof panel which receives the automobile sunroof when the automobile sunroof is in a fully closed position.

16. The system of claim 1 wherein:
    the translating device is an automobile deck lid.

17. The system of claim 16 wherein:
    the capacitance sensor is positioned on an edge of an automobile trunk which receives the automobile deck lid when the automobile deck lid is in a fully closed position.

18. The system of claim 1 wherein:
    the translating device is an automobile hatch.

19. The system of claim 18 wherein:
    the capacitance sensor is positioned on an automobile body panel which receives the automobile hatch when the automobile hatch is in a fully closed position.

20. The system of claim 1 wherein:
    the translating device is a pair of doors.

21. The system of claim 20 wherein:
    the capacitance sensor is positioned on one of the pair of doors which receives the other one of the pair of doors when the pair of doors are in a fully closed position.

22. The system of claim 1 wherein:
    the translating device includes a sliding door.

23. The system of claim 22 wherein:
    the sliding door includes a pair of sliding doors.

24. The system of claim 1 wherein:
    the translating door is a hinged door.

25. The system of claim 24 wherein:
    the capacitance sensor is positioned on the hinged door.

26. The system of claim 25 wherein:
    the hinged door includes a pair of hinged doors.

27. The system of claim 1 wherein:
    the translating device is a garage door.

28. The system of claim 27 wherein:
    the capacitance sensor is positioned on the garage door.

29. The system of claim 1 wherein:
    the translating device is a movable press mechanism.

30. The system of claim 29 wherein:
    the capacitance sensor is positioned on a press which receives the movable press mechanism.

31. The system of claim 1 wherein:
    the translating device is a tonneau cover.

32. The system of claim 1 wherein:
    the dielectric element includes a cell foam.

33. An anti-entrapment system for preventing an object from being entrapped by a translating device, the system comprising:
    a capacitance sensor positioned adjacent to a translating device, the capacitance sensor having first and second electrical conductors separated by a separation distance, a dielectric element interposed between the conductors, and an electrically non-conductive elastomer outer jacket encasing the conductors and the dielectric element, the capacitance sensor having a capacitance dependent upon the separation distance between the conductors;
    wherein the capacitance changes in response to a first electrically conductive object coming into proximity with at least one of the conductors; and
    a controller for controlling the translating device as a function of the capacitance in order to prevent the translating device from entrapping the object.

34. The system of claim 33 wherein:
    the dielectric element is compressible, wherein the capacitance changes in response to the separation distance between the conductors decreasing as a result of the dielectric element compressing in response to a second object touching the outer jacket;

wherein the controller controls the translating device as a function of the capacitance in order to prevent the translating device from entrapping either object.

35. The system of claim 33 wherein:
the dielectric element is non-compressible.

36. The system of claim 33 wherein:
the translating device is an automobile window, wherein a portion of the outer jacket is attached to a window weather seal in order to position the capacitance sensor adjacent to an automobile window frame.

37. The system of claim 36 wherein:
the outer jacket has angled side walls for attaching the portion of the outer jacket to the window weather seal.

38. The system of claim 36 wherein:
the outer jacket has straight side walls for attaching the portion of the outer jacket to the window weather seal.

39. The system of claim 33 wherein:
the conductors are conductor plates.

40. The system of claim 33 wherein:
each conductor plate has spaced apart slots arranged in a serpentine pattern.

41. An anti-entrapment system for preventing an object from being entrapped by a translating device, the system comprising:
a sensor positioned adjacent to a translating device, the sensor having an electrically non-conductive elastomer outer jacket having an interior filled with air, first and second electrically conductive elastomer carriers connected to opposite sides of the outer jacket and positioned within the air interior of the outer jacket, and first and second electrically conductive wires respectively sheathed in the first and second carriers;
wherein the carriers contact one another upon a compression force being applied to the outer jacket such that the configuration of the air interior changes and the carriers move towards and contact one another;
a controller connected to the wires for monitoring contact between the carriers, wherein upon contact of the carriers the controller prevents the translating device from moving in a selected direction in order to prevent the translating device from entrapping an object; and
an elastomer base upon which a portion of the outer jacket rests against, the elastomer base having a higher compression force compared to the compression force of the outer jacket required for changing the configuration of the air interior thereby providing an over-travel feature to prevent inertia from the translating device from causing high forces against an entrapped object.

42. An anti-entrapment system for preventing an object from being entrapped by a translating device, the system comprising:
a sensor positioned adjacent to a translating device, the sensor haying an electrically non-conductive elastomer outer jacket having an interior filled with an electrically conductive elastomer material, first and second electrically conductive elastomer carriers connected to opposite sides of the outer jacket and positioned within the interior of the outer jacket such that the carriers are separated from the elastomer material by respective air spaces, and first and second electrically conductive wires respectively sheathed in the first and second carriers;
wherein the carriers electrically contact one another via the elastomer material upon a compression force being applied to the outer jacket such that the configuration of the air spaces change and the carriers move towards and contact the elastomer material;

a controller connected to the wires for monitoring contact between the carriers and the elastomer material, wherein upon such contact the controller prevents the translating device from moving in a selected direction in order to prevent the translating device from entrapping an object;
wherein the elastomer material continues to compress after the carriers have contacted the elastomer material thereby providing an over-travel feature to prevent inertia from the translating device from causing high forces against an entrapped object.

43. An anti-entrapment system for preventing an object from being entrapped by a translating device, the system comprising:
a capacitance sensor positioned adjacent to a translating device, the capacitance sensor including an electrically conductive elastomer outer jacket having an interior filled with a dielectric medium, an electrically non-conductive elastomer carrier held at each end by the outer jacket within the interior of the outer jacket, and an electrically conductive fabric sheathed within the carrier and an electrical conductor wire encased by the outer jacket such that the conductive fabric and the conductor wire are separated from one another by a separation distance;
wherein capacitance of the capacitance sensor changes in response to the separation distance between the conductive fabric and the conductor wire changing as a result of the dielectric element compressing in response to a first object touching the outer jacket;
wherein capacitance of the capacitance sensor changes in response to a second electrically conductive object coming into proximity with at least one of the conductive fabric and the conductor wire; and
a controller connected to the conductive fabric and the conductor wire for controlling the translating device as a function of the capacitance of the capacitance sensor in order to prevent the translating device from entrapping either object.

44. The system of claim 43 wherein:
the controller is operable with the capacitance sensor in order to provide electrical energy to the conductive fabric to cause the conductive fabric to act as a heating element in order to heat the capacitance sensor.

45. The system of claim 44 wherein:
the controller controls the translating device to inhibit movement of the translating device while the conductive fabric is acting as a heating element.

46. The system of claim 43 wherein:
the controller is operable with the capacitance sensor in order to receive temperature signals from the conductive fabric indicative of the temperature of the conductive fabric.

47. An anti-entrapment system for preventing an object from being entrapped by a translating device, the system comprising:
a capacitance sensor positioned adjacent to a translating device, the capacitance sensor including an electrically non-conductive elastomer outer jacket having an interior filled with a dielectric medium, a first electrically conductive fabric attached to the exterior surface of the outer jacket and covered with flexible electrically non-conductive flocking material, and a second electrically conductive fabric encased within the outer jacket at a position opposite to the first conductive fabric such that the conductive fabrics are separated from one another by a separation distance;

wherein capacitance of the capacitance sensor changes in response to the separation distance between the conductive fabrics decreasing as a result of a first object touching the flocking material;

wherein capacitance of the capacitance sensor changes in response to a second electrically conductive object coming into proximity with the first conductive fabric; and a controller connected to the conductive fabrics for controlling the translating device as a function of the capacitance of the capacitance sensor in order to prevent the translating device from entrapping either object.

48. The system of claim 47 wherein:

the controller provides electrical energy to the first conductive fabric in order to cause the first conductive fabric to act as a heating element to heat the capacitance sensor.

49. The system of claim 48 wherein:

the controller controls the translating device to inhibit movement of the translating device while the first conductive fabric is acting as a heating element.

50. The system of claim 47 wherein:

the controller monitors the temperature of the first conductive fabric.

51. An anti-entrapment system for preventing an object from being entrapped by a translating device, the system comprising:

a capacitance sensor positioned adjacent to a translating device, the capacitance sensor including an electrically non-conductive elastomer outer jacket having an interior filled with a dielectric medium, a flexible electrically non-conductive flocking material attached to the exterior surface of the outer jacket and a first electrically conductive fabric attached to the interior surface of the outer jacket, and a second electrically conductive fabric encased within the outer jacket at a position opposite to the first conductive fabric such that the conductive fabrics are separated from one another by a separation distance;

wherein capacitance of the capacitance sensor changes in response to the separation distance between the conductive fabrics changing as a result of a first object touching the flocking material;

wherein capacitance of the capacitance sensor changes in response to a second electrically conductive object coming into proximity with the first conductive fabric; and a controller connected to the conductive fabrics for controlling the translating device as a function of the capacitance of the capacitance sensor in order to prevent the translating device from entrapping either object.

52. The system of claim 51 wherein:

the controller provides electrical energy to the first conductive fabric to cause the first conductive fabric to act as a heating element in order to heat the capacitance sensor.

53. The system of claim 52 wherein:

the controller controls the translating device to inhibit movement of the translating device while the first conductive fabric is acting as a heating element.

54. The system of claim 51 wherein:

the controller monitors the temperature of the first conductive fabric.

55. An anti-entrapment system for preventing an object from being entrapped by a translating device, the system comprising:

a capacitance sensor positioned adjacent to a translating device, the capacitance sensor including an electrically non-conductive elastomer outer jacket having an interior filled with a dielectric medium;

the capacitance sensor further including a first electrically conductive fabric attached to the interior surface of the outer jacket, a second electrically conductive fabric attached to the exterior surface of the outer jacket, and an electrically non-conductive flocking material covering the second conductive fabric on the exterior surface of the outer jacket;

the capacitance sensor further including a third electrically conductive fabric encased within the outer jacket at a position opposite to the first conductive fabric such that the first and third conductive fabrics are separated from one another by a separation distance;

wherein capacitance of the capacitance sensor changes in response to the separation distance between the first and third conductive fabrics changing as a result of a first object touching the flocking material;

wherein capacitance of the capacitance sensor changes in response to a second electrically conductive object coming into proximity with the first conductive fabric; and a controller connected to the conductive fabrics for controlling the translating device as a function of the capacitance of the capacitance sensor in order to prevent the translating device from entrapping either object.

56. The system of claim 55 wherein:

the controller provides electrical energy to the second conductive fabric to cause the second conductive fabric to act as a heating element in order to heat the capacitance sensor.

57. The system of claim 56 wherein:

the controller controls the translating device to inhibit movement of the translating device while the first conductive fabric is acting as a heating element.

58. The system of claim 55 wherein:

the controller monitors the temperature of the second conductive fabric.

59. An anti-entrapment system for preventing an object from being entrapped by a translating device, the system comprising:

an anti-pinch capacitance sensor strip positioned adjacent to a translating device, the capacitance sensor strip having first and second electrical conductors separated by a separation distance and a compressible dielectric element interposed between the conductors, the capacitance sensor strip having a capacitance dependent upon the separation distance between the conductors;

wherein the capacitance changes in response to the separation distance changing as a result of the dielectric element compressing in response to a first object touching the capacitance sensor;

wherein the capacitance changes in response to a second electrically conductive object coming into proximity with at least one of the conductors; and a controller for controlling the translating device as a function of the capacitance in order to prevent the translating device from entrapping either object.

60. The system of claim 59 wherein:
the capacitance sensor strip is in the form of a weather seal.

61. An anti-entrapment system for preventing an object from being entrapped by a translating device, the system comprising:
- a capacitance sensor positioned adjacent to a translating device, the capacitance sensor having a conductor separated from a metal frame by a separation distance, the capacitance sensor further having a non-conductive elastomer encasing the conductor and resting in a conductive elastomer, the surface of the non-conductive elastomer is exposed, the conductor having a capacitance dependent upon the separation distance;
- wherein the capacitance changes in response to a conductive object coming into proximity with the conductor; and
- a controller for controlling the translating device as a function of the capacitance in order to prevent the translating device from entrapping the object.

62. An anti-entrapment system for preventing an object from being entrapped by a translating device, the system comprising:
- a capacitance sensor positioned adjacent to a translating device, the capacitance sensor having a conductor separated from a metal frame by a separation distance, the capacitance sensor further having a non-conductive rigid covering encasing the conductor and resting on or in near proximity to the metal frame, the conductor having a capacitance dependent upon the separation distance;
- wherein the capacitance changes in response to a conductive object coming into proximity with the conductor; and
- a controller for controlling the translating device as a function of the capacitance in order to prevent the translating device from entrapping the object.

* * * * *